US011735614B2

(12) United States Patent
Eki

(10) Patent No.: US 11,735,614 B2
(45) Date of Patent: Aug. 22, 2023

(54) STACKED LIGHT-RECEIVING SENSOR AND ELECTRONIC DEVICE

(71) Applicant: Sony Semiconductor Solutions Corporation, Kanagawa (JP)

(72) Inventor: Ryoji Eki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 185 days.

(21) Appl. No.: 17/251,926

(22) PCT Filed: Jul. 30, 2019

(86) PCT No.: PCT/JP2019/029909
§ 371 (c)(1),
(2) Date: Dec. 14, 2020

(87) PCT Pub. No.: WO2020/027161
PCT Pub. Date: Feb. 6, 2020

(65) Prior Publication Data
US 2021/0266488 A1    Aug. 26, 2021

(30) Foreign Application Priority Data

Jul. 31, 2018 (JP) ................................ 2018-143973
Jul. 30, 2019 (JP) ................................ 2019-139439

(51) Int. Cl.
*H01L 27/146* (2006.01)
*G06V 10/82* (2022.01)
(Continued)

(52) U.S. Cl.
CPC ...... *H01L 27/14634* (2013.01); *G06F 18/214* (2023.01); *G06N 3/04* (2013.01);
(Continued)

(58) Field of Classification Search
CPC .. H04N 5/2253; H04N 5/23225; H04N 5/345; H04N 5/3698; H04N 5/37452;
(Continued)

(56) References Cited

U.S. PATENT DOCUMENTS 9,093,363 B2    7/2015  Sukegawa et al.
10,795,024 B2 * 10/2020  Eki .......................... G01S 17/93
(Continued)

FOREIGN PATENT DOCUMENTS

JP    2016163011 A    9/2016
JP    2018-74445 A    5/2018
(Continued)

OTHER PUBLICATIONS

Extended European Search Report dated Jul. 27, 2021 for corresponding European Application No. 19845060.3.
(Continued)

*Primary Examiner* — Lin Ye
*Assistant Examiner* — Chriss S Yoder, III
(74) *Attorney, Agent, or Firm* — Michael Best & Friedrich LLC

(57) ABSTRACT

Advanced processing is performed in a chip. A stacked light-receiving sensor according to an embodiment includes a first substrate (100, 200, 300) and a second substrate (120, 320) bonded to the first substrate. The first substrate includes a pixel array (101) in which a plurality of unit pixels are arranged in a two-dimensional matrix. The second substrate includes a converter (17) configured to convert an analog pixel signal output from the pixel array to digital image data and a processing unit (15) configured to perform a process based on a neural network calculation model for data based on the image data. At least a part of the converter is arranged
(Continued)

on a first side in the second substrate. The processing unit is arranged on a second side opposite to the first side in the second substrate.

21 Claims, 14 Drawing Sheets

(51) Int. Cl.
| | |
|---|---|
| *H04N 23/617* | (2023.01) |
| *H04N 7/18* | (2006.01) |
| *G06N 3/04* | (2023.01) |
| *G06F 18/214* | (2023.01) |
| *H04N 25/79* | (2023.01) |
| *H04N 25/44* | (2023.01) |
| *H04N 25/75* | (2023.01) |
| *H04N 25/709* | (2023.01) |
| *G06V 10/764* | (2022.01) |
| *G06V 10/147* | (2022.01) |
| *G06V 20/58* | (2022.01) |
| *G06V 20/59* | (2022.01) |

(52) U.S. Cl.
CPC .......... *G06V 10/147* (2022.01); *G06V 10/764* (2022.01); *G06V 10/82* (2022.01); *G06V 20/58* (2022.01); *G06V 20/584* (2022.01); *G06V 20/597* (2022.01); *H01L 27/14636* (2013.01); *H04N 7/18* (2013.01); *H04N 23/617* (2023.01); *H04N 25/44* (2023.01); *H04N 25/709* (2023.01); *H04N 25/75* (2023.01); *H04N 25/79* (2023.01)

(58) Field of Classification Search
CPC .... H04N 5/37455; H04N 5/378; H04N 5/379; H04N 7/18; H04N 23/54; H04N 23/617; H04N 25/44; H04N 25/709; H04N 25/75; H04N 25/771; H04N 25/772; H04N 25/79; H01L 27/14634; H01L 27/14636; G06K 9/6256; G06K 9/627; G06N 3/04; G06N 3/08; G06V 10/147; G06V 10/764; G06V 10/82; G06V 20/58; G06V 20/584; G06V 20/597; G06F 18/214; G06F 18/2413
See application file for complete search history.

(56) References Cited

U.S. PATENT DOCUMENTS

| | | | |
|---|---|---|---|
| 2004/0095495 A1* | 5/2004 | Inokuma | H04N 5/2253 348/308 |
| 2014/0077063 A1 | 3/2014 | Cho | |
| 2015/0296158 A1 | 10/2015 | Mansoorian | |
| 2015/0365569 A1 | 12/2015 | Mai et al. | |
| 2016/0014313 A1 | 1/2016 | Muller et al. | |
| 2017/0187931 A1 | 6/2017 | Onishi et al. | |
| 2018/0026068 A1 | 1/2018 | Ogi et al. | |
| 2018/0157892 A1* | 6/2018 | Han | G06V 10/143 |
| 2019/0253651 A1 | 8/2019 | Shida | |
| 2019/0303656 A1* | 10/2019 | Lin | G08B 21/0438 |

FOREIGN PATENT DOCUMENTS

| | | | |
|---|---|---|---|
| JP | 2018-107759 A | 7/2018 | |
| WO | 2018/051809 A1 | 3/2018 | |
| WO | WO-2018051809 A1 * | 3/2018 | .............. G01C 3/06 |
| WO | 2018/079331 A1 | 5/2018 | |

OTHER PUBLICATIONS

Extended European Search Report dated Aug. 2, 2021 for corresponding European Application No. 19844089.3.
International Search Report, International Application No. PCT/JP2019/029909, dated Sep. 26, 2019.
Notification of Transmittal of the International Search Report and the Written Opinion of the International Searching Authority, or the Declaration (PCT/ISA/220), International Application No. PCT/JP2019/029909, dated Oct. 8, 2019.

* cited by examiner

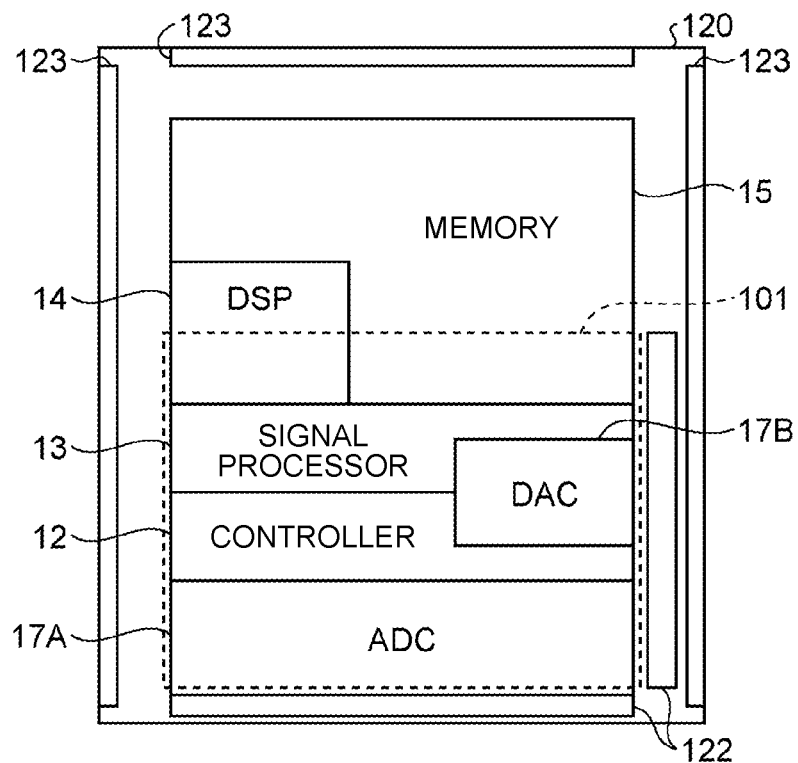
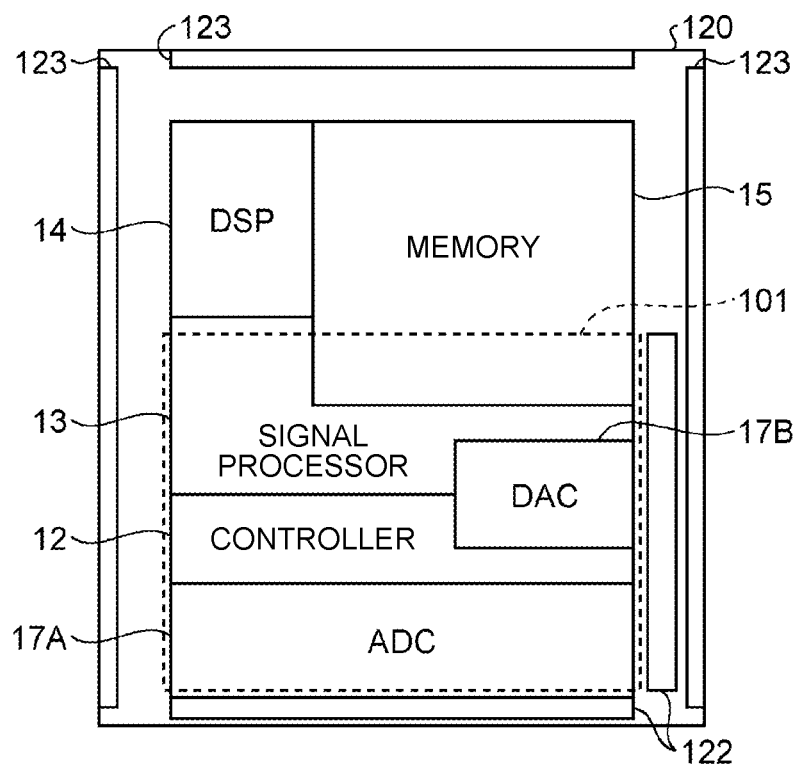

STACKED LIGHT-RECEIVING SENSOR AND ELECTRONIC DEVICE

FIELD

The present disclosure relates to a stacked light-receiving sensor and an electronic device.

BACKGROUND

Conventionally, flat-type image sensors in which chips such as a sensor chip, a memory chip, and a digital signal processor (DSP) chip are connected in parallel with bumps exist as imaging devices that acquire still images and moving images.

In recent years, one-chip image sensors having a stack structure in which a plurality of dies are stacked have been developed for the purpose of miniaturization of imaging devices.

CITATION LIST

Patent Literature

Patent Literature 1: WO2018/051809

SUMMARY

Technical Problem

In recent years, more advanced processing in image sensor chips is desired in terms of increasing the variety and the speed of image processing and protection of private information, for example.

The present disclosure develops a stacked light-receiving sensor and an electronic device capable of performing more advanced processing in a chip.

Solution to Problem

To solve the above-described problem, a stacked light-receiving sensor according to one aspect of the present disclosure comprises: a first substrate; and a second substrate bonded to the first substrate, the first substrate including a pixel array in which a plurality of unit pixels are arranged in a two-dimensional matrix, the second substrate including a converter configured to convert an analog pixel signal output from the pixel array to digital image data and a processing unit configured to perform a process based on a neural network calculation model for data based on the image data, wherein at least a part of the converter is disposed on a first side in the second substrate, and the processing unit is disposed on a second side opposite to the first side in the second substrate.

BRIEF DESCRIPTION OF DRAWINGS

FIG. 7 is a diagram illustrating a layout example of the second substrate in a fourth layout example according to the first embodiment.

FIG. 8 is a diagram illustrating a layout example of the second substrate in a fifth layout example according to the first embodiment.

DESCRIPTION OF EMBODIMENTS

Embodiments of the present disclosure will be described in detail below with reference to the drawings. In the following embodiments, the same parts are denoted by the same reference signs and an overlapping description will be omitted.

The present disclosure will be described in the order of items below.

1. First Embodiment 1.1 Overall Configuration Example of Imaging Device
1.2 Chip Configuration Example of Image Sensor Chip
1.3 Technical Problem of Image Sensor Chip Equipped with Processing Unit Performing Computation Based on Pre-Trained Model
1.4 Noise Reduction Method
1.4.1 First Layout Example
1.4.1.1 Layout Example of First Substrate
1.4.1.2 Layout Example of Second Substrate
1.4.2 Second Layout Example
1.4.3 Third Layout Example
1.4.4 Fourth Layout Example
1.4.5 Fifth Layout Example
1.4.6 Sixth Layout Example
1.4.7 Seventh Layout Example
1.4.8 Eighth Layout Example
1.4.9 Ninth Layout Example
1.5 Operation Effects

2. Second Embodiment 2.1 Chip Configuration Example of Image Sensor Chip
2.2 Operation Effects

3. Third Embodiment 3.1 Chip Configuration Example of Image Sensor Chip
3.2 Operation Effects
4. Application to Other Sensors
5. Application to Movable Body
6. Application to Endoscopic Surgery System
7. Application to Whole Slide Imaging (WSI) System

1. First Embodiment

First of all, a first embodiment will be described in detail with reference to the drawings.

1.1 Overall Configuration Example of Imaging Device

Figure 1:
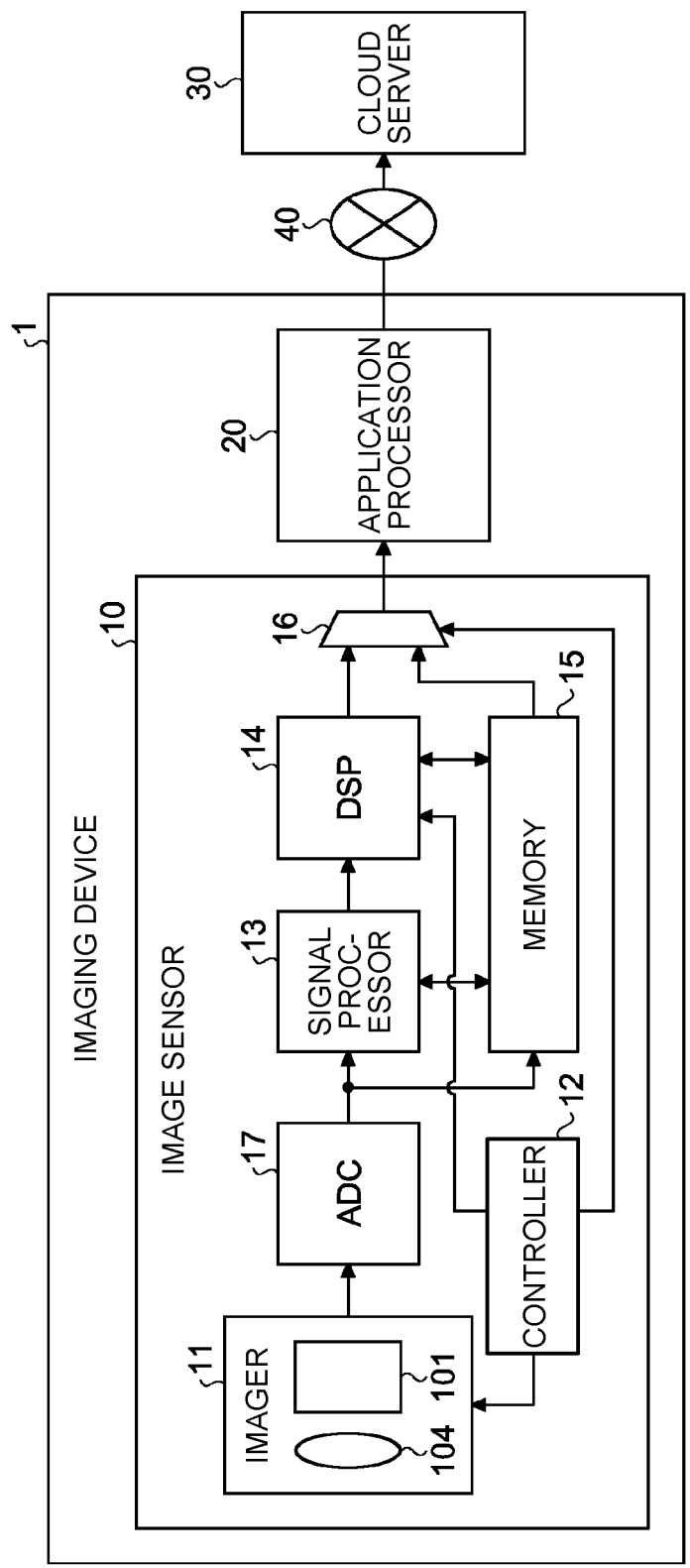
FIG. 1 is a block diagram illustrating an overall configuration example of an imaging device as an electronic device according to a first embodiment.

FIG. 1 is a block diagram illustrating an overall configuration example of an imaging device as an electronic device according to the first embodiment. As illustrated in FIG. 1, an imaging device 1 includes an image sensor 10 that is a solid-state imaging device and an application processor 20. The image sensor 10 includes an imager 11, a controller 12, a converter (analog-to-digital converter, hereinafter referred to as ADC) 17, a signal processor 13, a digital signal processor (DSP) 14, a memory 15, and a selector (also referred to as output module) 16.

The controller 12 controls each part in the image sensor 10 in accordance with user's operation or an operation mode being set.

The imager 11 includes, for example, an optical system 104 including a zoom lens, a focus lens, and an aperture, and a pixel array 101 having a configuration in which unit pixels (unit pixels 101a in FIG. 2) including light-receiving elements such as photodiodes are arranged in a two-dimensional matrix. External incident light passes through the optical system 104 to form an image on a light-receiving surface that is an array of light-receiving elements in the pixel array 101. Each unit pixel 101a in the pixel array 101 converts light incident on its light-receiving element into electricity to accumulate charge in accordance with the quantity of incident light so that the charge can be read out.

The ADC 17 converts an analog pixel signal for each unit pixel 101a read from the imager 11 to a digital value to generate digital image data and outputs the generated image data to the signal processor 13 and/or the memory 15. The ADC 17 may include a voltage generating circuit that generates a drive voltage for driving the imager 11 from power supply voltage and the like.

The signal processor 13 performs a variety of signal processing for digital image data input from the ADC 17 or digital image data read from the memory 15 (hereinafter referred to as process target image data).

For example, when the process target image data is a color image, the signal processor 13 converts the format of this image data to YUV image data, RGB image data, or the like. The signal processor 13 performs, for example, processing such as noise removal and white balance adjustment for the process target image data, if necessary. In addition, the signal processor 13 performs a variety of signal processing (also referred to as pre-processing) for the process target image data in order for the DSP 14 to process the image data.

The DSP 14 executes, for example, a computer program stored in the memory 15 to function as a processing unit that performs a variety of processing using a pre-trained model (also referred to as neural network calculation model) created by machine learning using a deep neural network (DNN). This pre-trained model (neural network calculation model) may be designed based on parameters generated by inputting, to a predetermined machine learning model, training data in which an input signal corresponding to output of the pixel array 101 is associated with a label for the input signal. The predetermined machine learning model may be a learning model using a multi-layer neural network (also referred to as multi-layer neural network model).

For example, the DSP 14 performs a computation process based on the pre-trained model stored in the memory 15 to perform a process of combining image data with a dictionary coefficient stored in the memory 15. The result obtained through such a computation process (computation result) is output to the memory 15 and/or the selector 16. The computation result may include image data obtained by performing a computation process using the pre-trained model and a variety of information (metadata) obtained from the image data. A memory controller for controlling access to the memory 15 may be embedded in the DSP 14.

The image data to be processed by the DSP 14 may be image data normally read out from the pixel array 101 or may be image data having a data size reduced by decimating pixels of the image data normally read out. Alternatively, the image data to be processed may be image data read out in a data size smaller than normal obtained by performing readout from the pixel array 101 with pixels decimated. As used herein "normal readout" may be readout without decimating pixels.

The memory 15 stores image data output from the ADC 17, image data subjected to signal processing by the signal processor 13, the computation result obtained from the DSP 14, and the like, if necessary. The memory 15 stores an algorithm of the pre-trained model to be executed by the DSP 14, in the form of a computer program and a dictionary coefficient.

The DSP 14 can perform the computation process described above by training a learning model by changing the weights of a variety of parameters in the learning model using training data, by preparing a plurality of learning models and changing a learning model to be used in accordance with a computation process, or by acquiring a pre-trained learning model from an external device.

The selector 16, for example, selectively outputs image data output from the DSP 14, or image data or a computation result stored in the memory 15, in accordance with a select control signal from the controller 12. When the DSP 14 does not process image data output from the signal processor 13 and the selector 16 outputs the image data output from the DSP 14, the selector 16 outputs the image data output from the signal processor 13 as it is.

As described above, the image data or the computation result output from the selector 16 is input to the application processor 20 that processes display and user interface. The application processor 20 is configured, for example, with a central processing unit (CPU) and executes an operating system and a variety of application software. This application processor 20 may be equipped with functions such as a graphics processing unit (GPU) and a baseband processor. The application processor 20 performs a variety of processes for the input image data or the computation result as necessary, or performs display to users, or transmits the input image data or the computation result to an external cloud server 30 through a predetermined network 40.

For example, a variety of networks such as the Internet, a wired local area network (LAN) or a wireless LAN, a mobile communication network, or Bluetooth (registered trademark) can be applied to the predetermined network 40. The image data or the computation result may be transmitted not only to the cloud server 30 but also to a variety of information processing devices (systems) having a communication function, such as a server operating on its own, a file server storing a variety of data, and a communication terminal such as a mobile phone.

1.2 Chip Configuration Example of Image Sensor Chip

An example of the chip configuration of the image sensor 10 illustrated in FIG. 1 will now be described in detail below with reference to the drawings.

Figure 2:
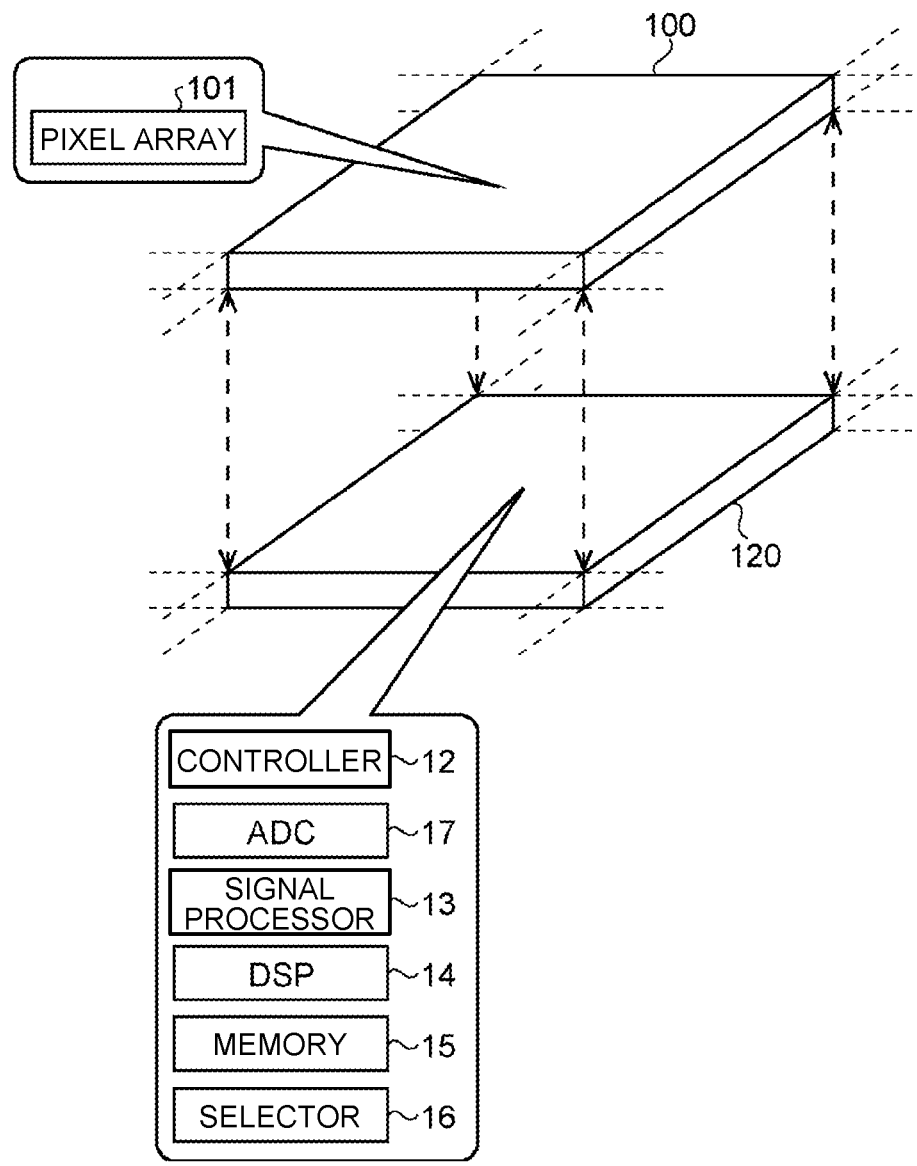
FIG. 2 is a diagram illustrating a chip configuration of an image sensor according to the first embodiment.

FIG. 2 is a diagram illustrating a chip configuration of the image sensor according to the present embodiment. As illustrated in FIG. 2, the image sensor 10 has a stack structure in which a first substrate (die) 100 shaped like a quadrangular flat plate and a second substrate (die) 120 similarly shaped like a quadrangular flat plate are bonded together.

The first substrate 100 and the second substrate may have the same size, for example. The first substrate 100 and the second substrate 120 each may be a semiconductor substrate such as a silicon substrate.

In the first substrate 100, in the configuration of the image sensor 10 illustrated in FIG. 1, the pixel array 101 of the imager 11 is arranged. A part or the whole of the optical system 104 may be provided on a chip in the first substrate 100.

In the second substrate 120, in the configuration of the image sensor 10 illustrated in FIG. 1, the ADC 17, the controller 12, the signal processor 13, the DSP 14, the memory 15, and the selector 16 are arranged. A not-illustrated interface circuit, driver circuit, and the like may be arranged in the second substrate 120.

The first substrate 100 and the second substrate 120 may be bonded together by chip-on-chip (CoC) technology in which the first substrate 100 and the second substrate 120 are individually diced into chips, and these diced first substrate 100 and second substrate 120 are bonded together, or by chip-on-wafer (CoW) technology in which one of the first substrate 100 and the second substrate 120 (for example, the first substrate 100) is diced into a chip, and the diced first substrate 100 is bonded to the second substrate 120 before dicing (that is, in a wafer state), or by wafer-on-wafer (WoW) technology in which the first substrate 100 and the second substrate 120 both in a wafer state are bonded together.

For example, plasma joining can be used as a joining process between the first substrate 100 and the second substrate 120. However, the present invention is not limited thereto and a variety of joining processes may be used.

1.3 Technical Problem of Image Sensor Chip Equipped with Processing Unit Performing Computation Based on Pre-Trained Model When the DSP 14 operates as a processing unit that performs a computation process based on a pre-trained model as described above, implementation of its operation algorithm is software implementation by running computer programs. Operation algorithms for pre-trained models are updated day by day. It is therefore difficult to grasp in advance, for example, at which timing the DSP 14 performing a computation process based on a pre-trained model performs a process or at which timing a process of the DSP 14 peaks.

As illustrated in FIG. 2, in the case where the DSP 14 operates as a processing unit that performs computation based on a pre-trained model in a chip configuration in which the pixel array 101 is mounted on the first substrate 100 and the DSP 14 is mounted on the second substrate 120, if the DSP 14 starts a computation process or a process in the DSP 14 reaches a peak during resetting of the pixel array 101, during exposure of the pixel array 101, or during readout of a pixel signal from each unit pixel 101a of the pixel array 101, noise (for example, fluctuations of current or electric field) is superimposed on a pixel signal read out from the pixel array 101, and consequently, the quality of the image acquired by the image sensor 10 is deteriorated.

The present embodiment then reduces intrusion of noise resulting from the signal processing by the DSP 14 into the pixel array 101, by adjusting the positional relation between the pixel array 101 and the DSP 14. Accordingly, an image with less deterioration in quality can be acquired even when the DSP 14 operates as a processing unit that performs computation based on a pre-trained model.

1.4 Noise Reduction Method

The positional relation between the pixel array 101 and the DSP 14 according to the present embodiment will now be described in detail below with reference to the drawings. In the following, the positional relation between the pixel array 101 and the DSP 14 will be described by taking several examples of the layout (also referred to as floor map) of layers (the first substrate 100 and the second substrate 120).

1.4.1 First Layout Example

Figure 3:
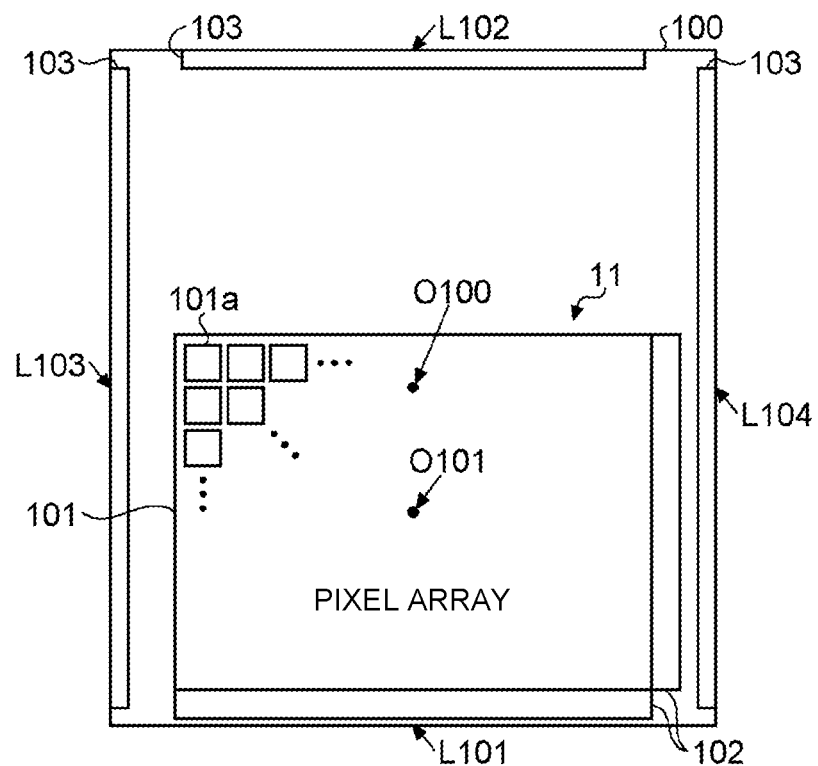
FIG. 3 is a diagram illustrating a layout example of a first substrate in a first layout example according to the first embodiment.
Figure 4:
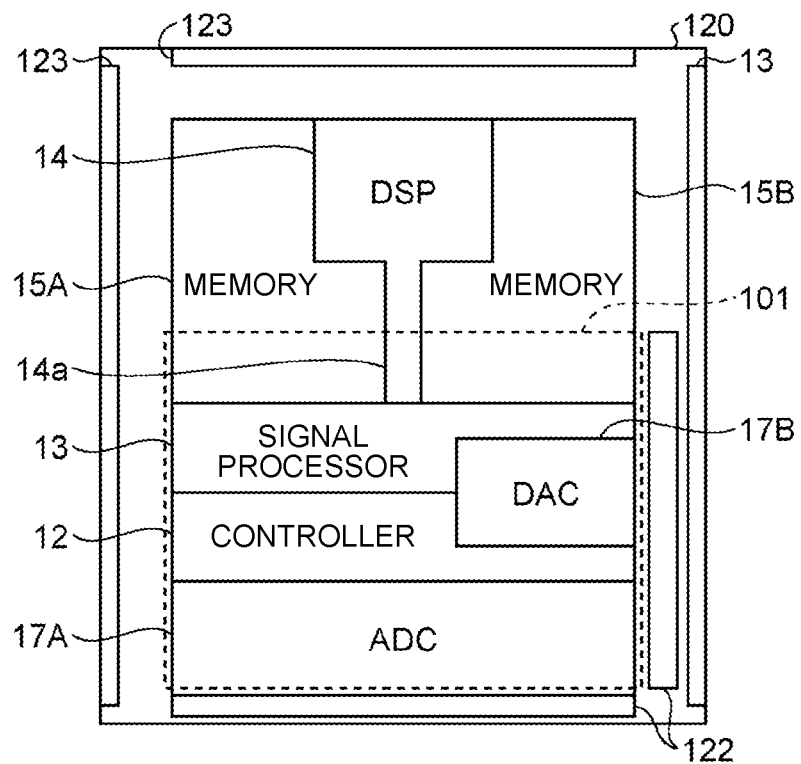
FIG. 4 is a diagram illustrating a layout example of a second substrate in the first layout example according to the first embodiment.

FIG. 3 and FIG. 4 are diagrams for explaining a first layout example according to the present embodiment. FIG. 3 illustrates a layout example of the first substrate 100, and FIG. 4 illustrates a layout example of the second substrate 120.

1.4.1.1 Layout Example of First Substrate

As illustrated in FIG. 3, in the first substrate 100, in the configuration of the image sensor 10 illustrated in FIG. 1, the pixel array 101 of the imager 11 is arranged. When a part or the whole of the optical system 104 is mounted on the first substrate 100, it is provided at a position corresponding to the pixel array 101.

The pixel array 101 is arranged off-center to one side L101 among four sides L101 to L104 of the first substrate 100. In other words, the pixel array 101 is arranged such that its center O101 is more proximate to the side L101 than the center O100 of the first substrate 100. When the surface having the pixel array 101 in the first substrate 100 is rectangular, the side L101 may be, for example, a shorter side. However, the present invention is not limited thereto, and the pixel array 101 may be arranged off-center to a longer side.

In a region proximate to the side L101 among four sides of the pixel array 101, in other words, a region between the side L101 and the pixel array 101, a TSV array 102 is provided, in which a plurality of through silicon vias (hereinafter referred to as TSVs) passing through the first substrate 100 are arranged as wiring for electrically connecting each unit pixel 101a in the pixel array 101 to the ADC 17 arranged in the second substrate 120. In this way, the TSV array 102 is provided in proximity to the side L101 proximate to the pixel array 101 to ensure a space for each part such as the ADC 17 in the second substrate 120.

The TSV array 102 may also be provided in a region proximate to one side L104 (or may be the side L103) of two sides L103 and L104 intersecting the side L101, in other words, in a region between the side L104 (or the side L103) and the pixel array 101.

A pad array 103 having a plurality of pads arranged linearly is provided on each of the sides L102 and L103 on which the pixel array 101 is not arranged off-center, among four sides L101 to L104 of the first substrate 100. The pads included in the pad array 103 include, for example, a pad (also referred to as power supply pin) receiving power supply voltage for analog circuits such as the pixel array 101 and the ADC 17, a pad (also referred to as power supply pin) receiving power supply voltage for digital circuits such as the signal processor 13, the DSP 14, the memory 15, the selector 16, and the controller 12, a pad (also referred to as signal pin) for interfaces such as a mobile industry processor interface (MIPI) and a serial peripheral interface (SPI), and a pad (also referred to as signal pin) for input/output of clock and data. Each pad is electrically connected to, for example, an external power supply circuit or an interface circuit through a wire. It is preferable that each pad array 103 and the TSV array 102 are sufficiently spaced apart to such a degree that influences of reflection of signals from the wire connected to each pad in the pad array 103 can be ignored.

1.4.1.2 Layout Example of Second Substrate

On the other hand, as illustrated in FIG. 4, in the second substrate 120, in the configuration of the image sensor 10 illustrated in FIG. 1, the ADC 17, the controller 12, the signal processor 13, the DSP 14, and the memory 15 are arranged. In the first layout example, the memory 15 is divided into two regions: a memory 15A and a memory 15B. Similarly, the ADC 17 is divided into two regions: an ADC 17A and a digital-to-analog converter (DAC) 17B. The DAC 17B supplies a reference voltage for AD conversion to the ADC 17A and, broadly speaking, is included in a part of the ADC 17. Although not illustrated in FIG. 4, the selector 16 is also arranged on the second substrate 120.

The second substrate 120 also has wiring 122 in contact with and electrically connected to the TSVs in the TSV array 102 passing through the first substrate 100 (hereinafter simply referred to as TSV array 102), and a pad array 123 in which a plurality of pads electrically connected to the pads in the pad array 103 of the first substrate 100 are arranged linearly.

For the connection between the TSV array 102 and the wiring 122, for example, the following technology can be employed: twin TSV technology in which two TSVs, namely, a TSV provided in the first substrate 100 and a TSV provided from the first substrate 100 to the second substrate 120 are connected with the chip facing out, or shared TSV technology in which a shared TSV provided from the first substrate 100 to the second substrate 120 provides connection. However, the present invention is not limited thereto, and a variety of connection modes can be employed. Examples include Cu—Cu bonding in which copper (Cu) exposed on the joint surface of the first substrate 100 and Cu exposed on the joint surface of the second substrate 120 are joined.

The connection mode between the pads in the pad array 103 on the first substrate 100 and the pads in the pad array 123 of the second substrate 120 may be, for example, wire bonding. However, the present invention is not limited thereto, and connection modes such as through holes and castellation may be employed.

In a layout example of the second substrate 120, for example, the ADC 17A, the signal processor 13, and the DSP 14 are arranged in order from the upstream side along the flow of a signal read out from the pixel array 101, where the upstream side is the vicinity of the wiring 122 connected to the TSV array 102. That is, the ADC 17A to which a pixel signal read out from the pixel array 101 is initially input is arranged in the vicinity of the wiring 122 on the most upstream side, next the signal processor 13 is arranged, and the DSP 14 is arranged in a region farthest from the wiring 122. Such a layout in which the ADC 17 to the DSP 14 are arranged from the upstream side along the flow of a signal can shorten the wiring connecting the parts. This layout leads to reduction in signal delay, reduction in signal propagation loss, improvement of the S/N ratio, and lower power consumption.

The controller 12 is arranged, for example, in the vicinity of the wiring 122 on the upstream side. In FIG. 4, the controller 12 is arranged between the ADC 17A and the signal processor 13. Such a layout leads to reduction in signal delay, reduction in signal propagation loss, improvement of the S/N ratio, and lower power consumption when the controller 12 controls the pixel array 101. Advantageously, the signal pin and the power supply pin for analog circuits can be collectively arranged in the vicinity of the analog circuits (for example, in the lower side of FIG. 4), the remaining signal pin and power supply pin for digital circuits can be collectively arranged in the vicinity of the digital circuits (for example, in the upper side of FIG. 4), or the power supply pin for analog circuits and the power supply pin for digital circuits can be sufficiently spaced apart from each other.

In the layout illustrated in FIG. 4, the DSP 14 is arranged on the side opposite to the ADC 17A on the most downstream side. With such a layout, in other words, the DSP 14 can be arranged in a region not overlapping with the pixel array 101 in the stacking direction of the first substrate 100 and the second substrate 120 (hereinafter simply referred to as top-bottom direction).

In this way, in the configuration in which the pixel array 101 and the DSP 14 are not superimposed in the top-bottom direction, intrusion of noise produced due to signal processing by the DSP 14 into the pixel array 101 can be reduced. As a result, even when the DSP 14 operates as a processing unit that performs computation based on a pre-trained model, intrusion of noise resulting from signal processing by the DSP 14 into the pixel array 101 can be reduced, and consequently, an image with less deterioration in quality can be acquired.

The DSP 14 and the signal processor 13 are connected by an interconnect 14a configured with a part of the DSP 14 or a signal line. The selector 16 is arranged, for example, in the vicinity of the DSP 14. When the interconnect 14a is a part of the DSP 14, the DSP 14 may partially overlap with the pixel array 101 in the top-bottom direction. However, even in such a case, compared with when the whole of the DSP 14 is superimposed on the pixel array 101 in the top-bottom direction, intrusion of noise into the pixel array 101 can be reduced.

Memories 15A and 15B are arranged, for example, so as to surround the DSP 14 from three directions. In such an arrangement of the memories 15A and 15B surrounding the DSP 14, the distance of wiring between each memory element in the memory 15 and the DSP 14 can be averaged while the distance can be reduced as a whole. Consequently, signal delay, signal propagation loss, and power consumption can be reduced when the DSP 14 accesses the memory 15.

The pad array 123 is arranged, for example, at a position on the second substrate 120 corresponding to the pad array 103 of the first substrate 100 in the top-bottom direction. Here, among the pads included in the pad array 123, a pad positioned in the vicinity of the ADC 17A is used for propagation of power supply voltage for analog circuits (mainly the ADC 17A) or an analog signal. On the other hand, a pad positioned in the vicinity of the controller 12, the signal processor 13, the DSP 14, or the memories 15A and 15B is used for propagation of power supply voltage for digital circuits (mainly, the controller 12, the signal processor 13, the DSP 14, the memories 15A and 15B) and a digital signal. Such a pad layout can reduce the distance of wiring connecting the pads to the parts. This layout leads to reduction in signal delay, reduction in propagation loss of signals and power supply voltage, improvement of the S/N ratio, and lower power consumption.

1.4.2 Second Layout Example

A second layout example will now be described. In the second layout example, the layout example of the first substrate 100 may be similar to the layout example described with reference to FIG. 3 in the first layout example.

Figure 5:
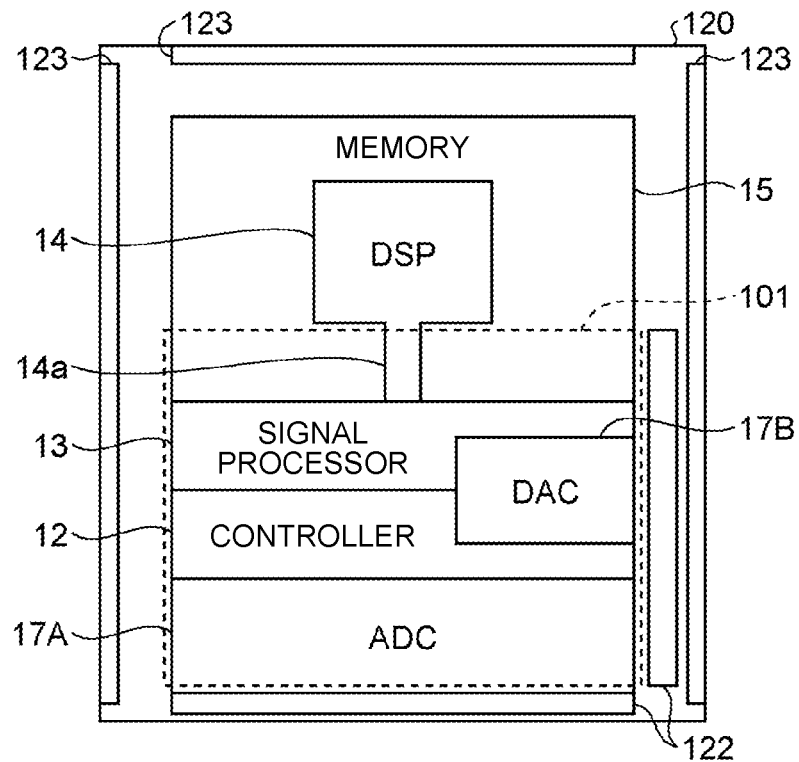
FIG. 5 is a diagram illustrating a layout example of the second substrate in a second layout example according to the first embodiment.

FIG. 5 is a diagram illustrating a layout example of the second substrate in the second layout example. As illustrated in FIG. 5, in the second layout example, in a layout similar to the first layout example, the DSP 14 is arranged at the center of a region in which the DSP 14 and the memory 15 are arranged. In other words, in the second layout example, the memory 15 is arranged so as to surround the DSP 14 from four directions.

In such an arrangement of the memories 15A and 15B surrounding the DSP 14 from four directions, the distance of wiring between each memory element in the memory 15 and the DSP 14 can be further averaged while the distance can be further reduced as a whole. Consequently, signal delay, signal propagation loss, and power consumption can be further reduced when the DSP 14 accesses the memory 15.

In FIG. 5, the DSP 14 and the pixel array 101 are arranged so as not to be superimposed on each other in the top-bottom direction. However, the present invention is not limited thereto, and the DSP 14 may be partially superimposed on the pixel array 101 in the top-bottom direction. Even in such a case, compared with when the whole of the DSP 14 is superimposed on the pixel array 101 in the top-bottom direction, intrusion of noise into the pixel array 101 can be reduced.

The other layout may be similar to the first layout example and is not further elaborated here.

1.4.3 Third Layout Example

A third layout example will now be described. In the third layout example, the layout example of the first substrate 100 may be similar to the layout example described with reference to FIG. 3 in the first layout example.

Figure 6:
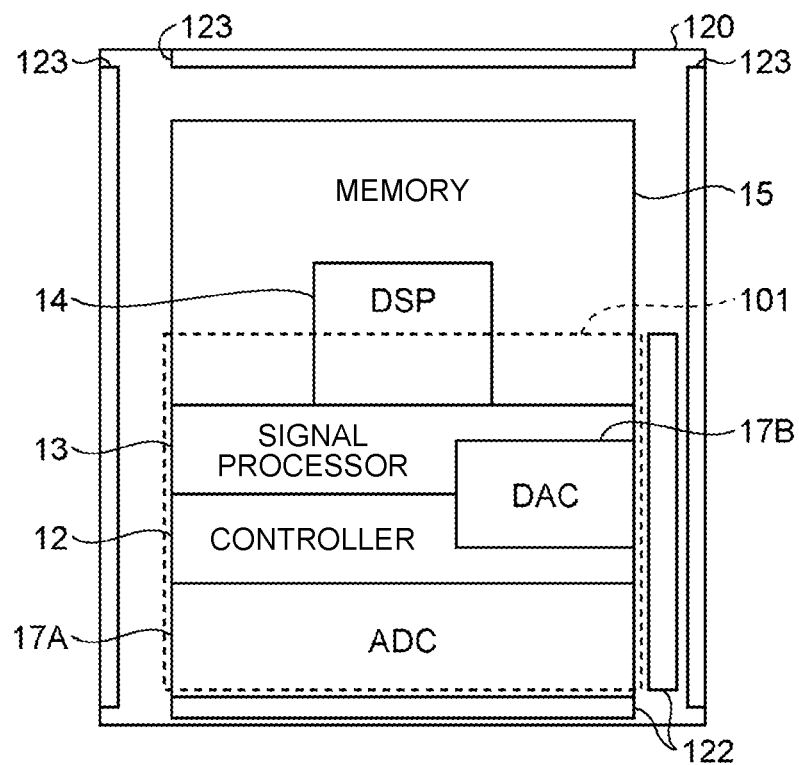
FIG. 6 is a diagram illustrating a layout example of the second substrate in a third layout example according to the first embodiment.

FIG. 6 is a diagram illustrating a layout example of the second substrate in the third layout example. As illustrated in FIG. 6, in the third layout example, in a layout similar to the first layout example, the DSP 14 is arranged adjacent to the signal processor 13. In such a configuration, the signal line from the signal processor 13 to the DSP 14 can be shortened. This layout leads to reduction in signal delay, reduction in propagation loss of signals and power supply voltage, improvement of the S/N ratio, and lower power consumption.

In the third layout example, the memory 15 is arranged so as to surround the DSP 14 from three directions. Consequently, signal delay, signal propagation loss, and power consumption can be reduced when the DSP 14 accesses the memory 15.

In the third layout example, the DSP 14 is partially superimposed on the pixel array 101 in the top-bottom direction. Even in such a case, compared with when the whole of the DSP 14 is superimposed on the pixel array 101 in the top-bottom direction, intrusion of noise into the pixel array 101 can be reduced.

The other layout may be similar to the other layout examples and is not further elaborated here.

1.4.4 Fourth Layout Example

A fourth layout example will now be described. In the fourth layout example, the layout example of the first substrate 100 may be similar to the layout example described with reference to FIG. 3 in the first layout example.

FIG. 7 is a diagram illustrating a layout example of the second substrate in the fourth layout example. As illustrated in FIG. 7, in the fourth layout example, in a layout similar to the third layout example, that is, in a layout in which the DSP 14 is arranged adjacent to the signal processor 13, the DSP 14 is arranged at a position far from both of two TSV arrays 102.

In such an arrangement of the DSP 14 at a position far from both of two TSV arrays 102, since the ADC 17A to the DSP 14 can be arranged more faithfully to the signal flow, the signal line from the signal processor 13 to the DSP 14 can be further shortened. As a result, signal delay, signal propagation loss, and power consumption can be further reduced.

In the fourth layout example, the memory 15 is arranged so as to surround the DSP 14 from two directions. Consequently, signal delay, signal propagation loss, and power consumption can be reduced when the DSP 14 accesses the memory 15.

In the fourth layout example, the DSP 14 is partially superimposed on the pixel array 101 in the top-bottom direction. Even in such a case, compared with when the whole of the DSP 14 is superimposed on the pixel array 101 in the top-bottom direction, intrusion of noise into the pixel array 101 can be reduced.

The other layout may be similar to the other layout examples and is not further elaborated here.

1.4.5 Fifth Layout Example

A fifth layout example will now be described. In the fifth layout example, the layout example of the first substrate 100 may be similar to the layout example described with reference to FIG. 3 in the first layout example.

FIG. 8 is a diagram illustrating a layout example of the second substrate in the fifth layout example. As illustrated in FIG. 8, in the fifth layout example, in a layout similar to the first layout example, that is, in a layout in which the DSP 14 is arranged on the most downstream side, the DSP 14 is arranged at a position far from both of two TSV arrays 102.

Even in such an arrangement, since the ADC 17A to the DSP 14 can be arranged more faithfully to the signal flow, the signal line from the signal processor 13 to the DSP 14 can be further shortened. As a result, signal delay, signal propagation loss, and power consumption can be further reduced.

The other layout may be similar to the other layout examples and is not further elaborated here.

1.4.6 Sixth Layout Example

A sixth layout example will now be described. In the sixth layout example, the layout example of the first substrate 100 may be similar to the layout example described with reference to FIG. 3 in the first layout example.

Figure 9:
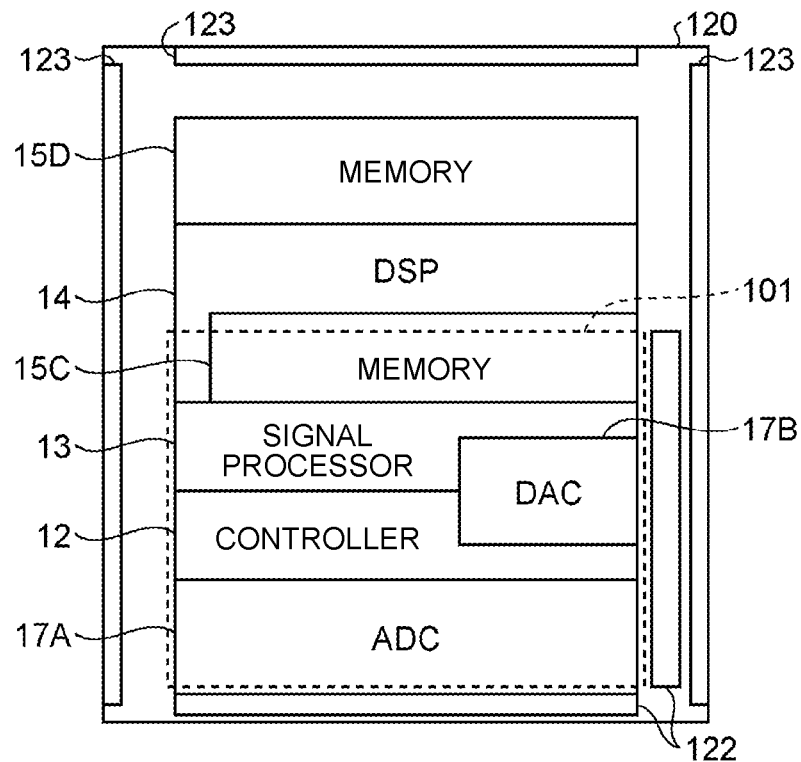
FIG. 9 is a diagram illustrating a layout example of the second substrate in a sixth layout example according to the first embodiment.

FIG. 9 is a diagram illustrating a layout example of the second substrate in the sixth layout example. As illustrated in FIG. 9, in the sixth layout example, the DSP 14 is sandwiched in the top-bottom direction in the drawing between memories 15C and 15D divided into two regions.

In such an arrangement of the memories 15C and 15D sandwiching the DSP 14, the distance of wiring between each memory element in the memory 15 and the DSP 14 can be averaged while the distance can be reduced as a whole. Consequently, signal delay, signal propagation loss, and power consumption can be further reduced when the DSP 14 accesses the memory 15.

The other layout may be similar to the first layout example and is not further elaborated here.

1.4.7 Seventh Layout Example

A seventh layout example will now be described. In the seventh layout example, the layout example of the first substrate 100 may be similar to the layout example described with reference to FIG. 3 in the first layout example.

Figure 10:
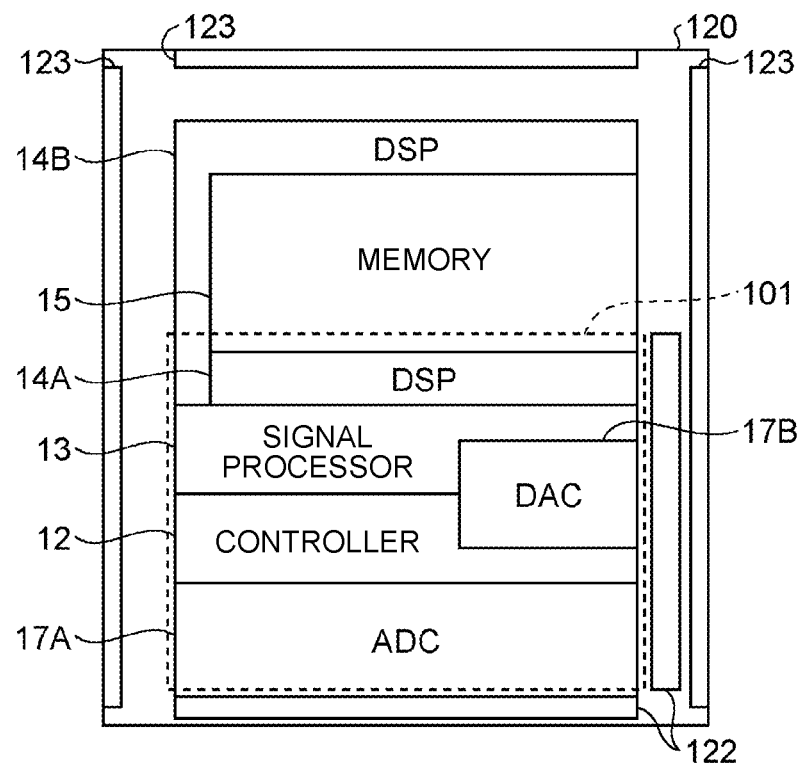
FIG. 10 is a diagram illustrating a layout example of the second substrate in a seventh layout example according to the first embodiment.

FIG. 10 is a diagram illustrating a layout example of the second substrate in the seventh layout example. As illustrated in FIG. 10, in the seventh layout example, the memory 15 is sandwiched in the top-bottom direction in the drawing between DSPs 14A and 14B divided into two regions.

In such an arrangement of the DSPs 14A and 14B sandwiching the memory 15, the distance of wiring between each memory element in the memory 15 and the DSP 14 can be averaged while the distance can be reduced as a whole. Consequently, signal delay, signal propagation loss, and power consumption can be further reduced when the DSP 14 accesses the memory 15.

The other layout may be similar to the first layout example and is not further elaborated here.

1.4.8 Eighth Layout Example

An eighth layout example will now be described. In the eighth layout example, the layout example of the first substrate 100 may be similar to the layout example described with reference to FIG. 3 in the first layout example.

Figure 11:
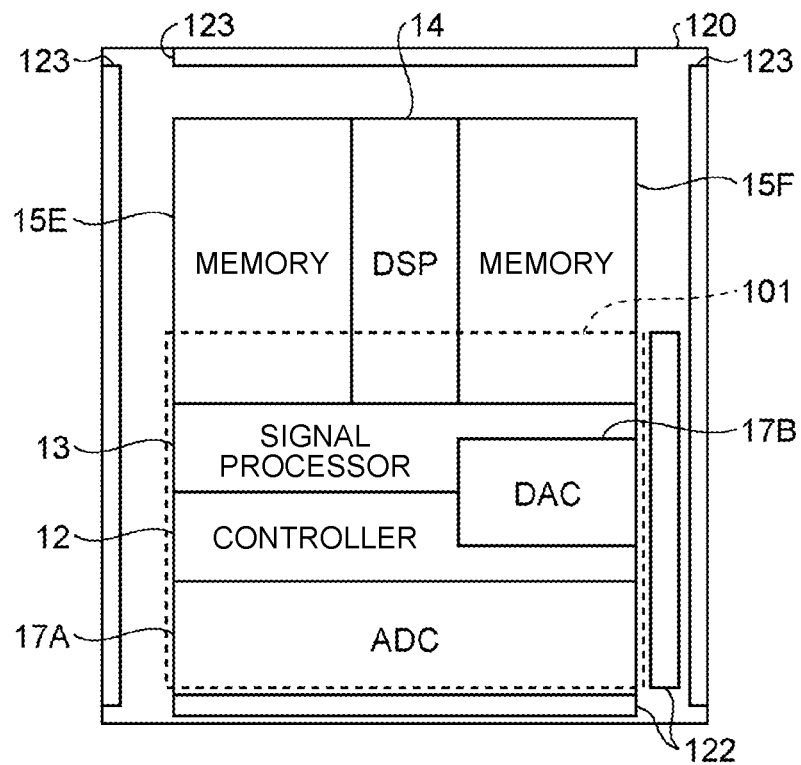
FIG. 11 is a diagram illustrating a layout example of the second substrate in an eighth layout example according to the first embodiment.

FIG. 11 is a diagram illustrating a layout example of the second substrate in the eighth layout example. As illustrated in FIG. 11, in the eighth layout example, the DSP 14 is sandwiched in the left-right direction in the drawing between memories 15E and 15F divided into two regions.

In such an arrangement of the memories 15C and 15D sandwiching the DSP 14, the distance of wiring between each memory element in the memory 15 and the DSP 14 can be averaged while the distance can be reduced as a whole. Consequently, signal delay, signal propagation loss, and power consumption can be further reduced when the DSP 14 accesses the memory 15.

The other layout may be similar to the first layout example and is not further elaborated here.

1.4.9 Ninth Layout Example

A ninth layout example will now be described. In the ninth layout example, the layout example of the first substrate 100 may be similar to the layout example described with reference to FIG. 3 in the first layout example.

Figure 12:
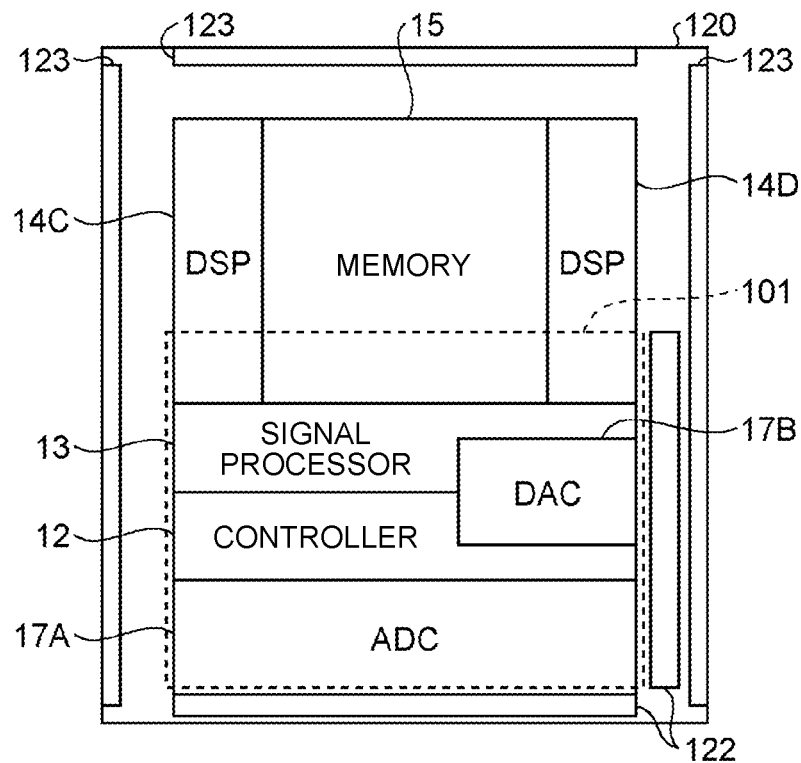
FIG. 12 is a diagram illustrating a layout example of the second substrate in a ninth layout example according to the first embodiment.

FIG. 12 is a diagram illustrating a layout example of the second substrate in the ninth layout example. As illustrated in FIG. 12, in the ninth layout example, the memory 15 is sandwiched in the left-right direction in the drawing between DSPs 14C and 14D divided into two regions.

In such an arrangement of the DSPs 14C and 14D sandwiching the memory 15, the distance of wiring between each memory element in the memory 15 and the DSP 14 can be averaged while the distance can be reduced as a whole. Consequently, signal delay, signal propagation loss, and power consumption can be further reduced when the DSP 14 accesses the memory 15.

The other layout may be similar to the first layout example and is not further elaborated here.

1.5 Operation Effects

As described above, according to the present embodiment, the positional relation between the pixel array 101 and the DSP 14 is adjusted such that at least a part of the DSP 14 of the second substrate 120 is not superimposed on the pixel array 101 in the stacking direction (the top-bottom direction) of the first substrate 100 and the second substrate 120. This configuration can reduce intrusion of noise resulting from signal processing by the DSP 14 into the pixel array 101 and therefore can provide an image with less deteriorated quality even when the DSP 14 operates as a processing unit that performs computation based on a pre-trained model.

2. Second Embodiment

A second embodiment will now be described in detail with reference to the drawings. In the following description, a configuration similar to the first embodiment is denoted by the same reference sign and an overlapping description thereof is omitted.

An imaging device as an electronic device according to the second embodiment may be similar to, for example, the imaging device 1 described in the first embodiment with reference to FIG. 1, which is hereby referred to and will not be further elaborated.

2.1 Chip Configuration Example of Image Sensor Chip

Figure 13:
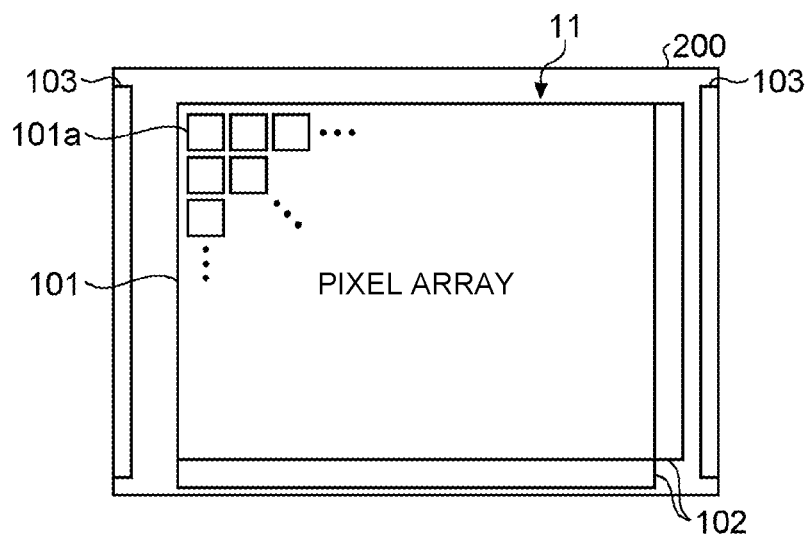
FIG. 13 is a layout diagram illustrating an overall configuration example of the first substrate in an image sensor according to a second embodiment.
Figure 14:
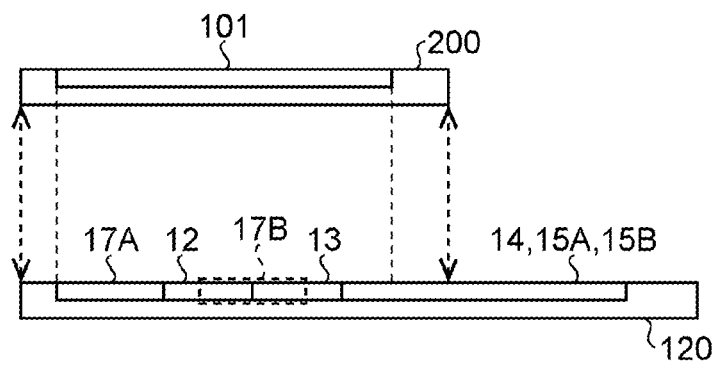
FIG. 14 is a diagram illustrating a chip configuration example of the image sensor according to the second embodiment.

An example of the chip configuration of an image sensor according to the present embodiment will now be described in detail below with reference to the drawings. FIG. 13 is a layout diagram illustrating an overall configuration example of the first substrate in the image sensor according to the present embodiment. FIG. 14 is a diagram illustrating a chip configuration example of the image sensor according to the present embodiment.

As illustrated in FIG. 13 and FIG. 14, in the present embodiment, the size of the first substrate 200 is smaller than the size of the second substrate 120. For example, the size of the first substrate 200 is reduced in accordance with the size of the pixel array 101. With such size reduction of the first substrate 200, many first substrates 200 can be fabricated from a single semiconductor wafer. Furthermore, the chip size of the image sensor 10 can be reduced.

For the bonding between the first substrate 200 and the second substrate 120, chip-on-chip (CoC) technology in which the first substrate 200 and the second substrate 120 are individually diced into chips and then bonded, or chip-on-wafer (CoW) technology in which the diced first substrate 200 is bonded to the second substrate 120 in a wafer state can be employed.

The layout of the first substrate 200 may be similar to, for example, the layout of the first substrate 100 illustrated in the first embodiment, excluding the upper portion. The layout of the second substrate 120 may be similar to, for example, the second substrate 120 illustrated in the first embodiment. The bonding place between the first substrate 200 to the second substrate 120 may be a position where at least a part of the pixel array 101 does not overlap the DSP 14 of the second substrate 120 in the top-bottom direction, in the same manner as in the first embodiment.

2.2 Operation Effects

As described above, even when the first substrate 200 is downsized in accordance with the size of the pixel array 101, intrusion of noise resulting from signal processing by the DSP 14 into the pixel array 101 can be reduced, in the same manner as in the first embodiment. Consequently, an image with less deterioration in quality can be acquired even when the DSP 14 operates as a processing unit that performs computation based on a pre-trained model. The other configuration (including the layout example of the second substrate 120) and effects may be similar to those of the first embodiment and will not be further elaborated here.

3. Third Embodiment

A third embodiment will now be described in detail with reference to the drawings. In the following description, a configuration similar to the first or second embodiment is denoted by the same reference sign and an overlapping description thereof is omitted.

An imaging device as an electronic device according to the third embodiment may be similar to, for example, the imaging device 1 described in the first embodiment with reference to FIG. 1, which is hereby referred to and will not be further elaborated.

3.1 Chip Configuration Example of Image Sensor Chip

Figure 15:
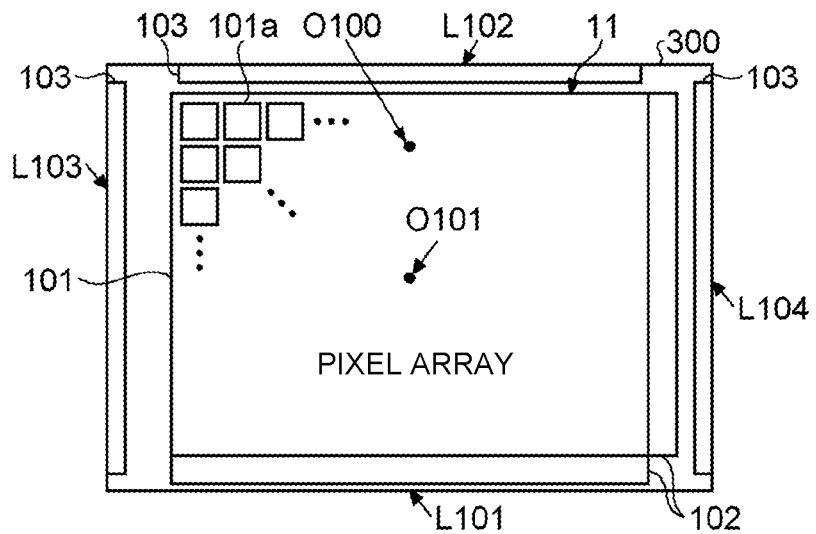
FIG. 15 is a layout diagram illustrating an overall configuration example of the first substrate in an image sensor according to a third embodiment.
Figure 16:
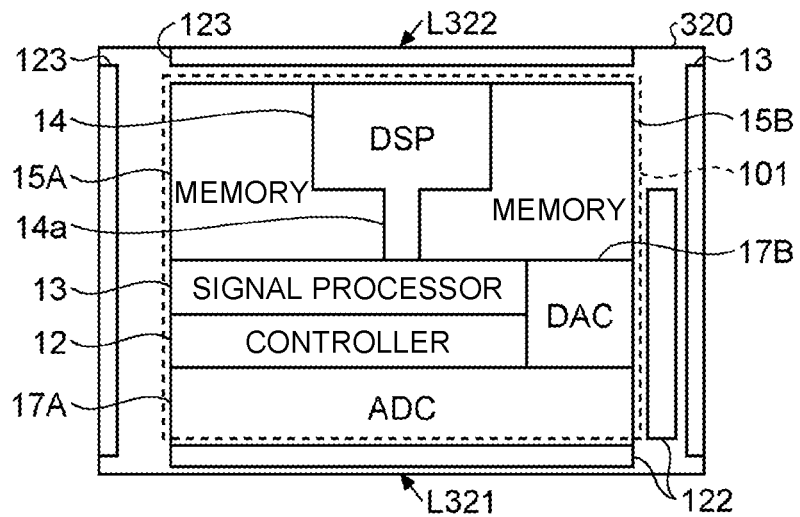
FIG. 16 is a layout diagram illustrating an overall configuration example of the second substrate in the image sensor according to the third embodiment.
Figure 17:
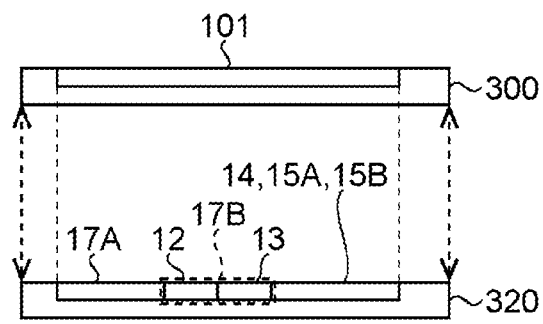
FIG. 17 is a diagram illustrating a chip configuration example of the image sensor according to the third embodiment.

An example of the chip configuration of an image sensor according to the present embodiment will now be described in detail below with reference to the drawings. FIG. 15 is a layout diagram illustrating an overall configuration example of the first substrate in the image sensor according to the present embodiment. FIG. 16 is a layout diagram illustrating an overall configuration example of the second substrate in the image sensor according to the present embodiment. FIG. 17 is a diagram illustrating a chip configuration example of the image sensor according to the present embodiment.

As illustrated in FIG. 15 to FIG. 17, in the present embodiment, the size of the first substrate 300 is reduced in accordance with the size of the pixel array 101. In the present embodiment, the size of the second substrate 320 is reduced to the same degree as the size of the first substrate 300. With such a configuration, in the present embodiment, a surplus region of the first substrate 300 can be reduced, and the chip size of the image sensor 10 can be further reduced accordingly.

However, in the present embodiment, the pixel array 101 and the DSP 14 are superimposed on each other in the stacking direction of the first substrate 300 and the second substrate 320 (hereinafter simply referred to as top-bottom direction). Because of this, noise resulting from the DSP 14 may be superimposed on a pixel signal read out from the pixel array 101 in some cases and may reduce the quality of an image acquired by the image sensor 10.

Then, in the present embodiment, the ADC 17A and the DSP 14 are spaced apart from each other. Specifically, for example, the ADC 17A is arranged closer to one end L321 of the second substrate 320, while the DSP 14 is arranged closer to an end L322 on the side opposite to the end L321 at which the ADC 17A is disposed.

With such an arrangement, noise propagating from the DSP 14 to the ADC 17A can be reduced, thereby suppressing deterioration in quality of an image acquired by the image sensor 10. The end L321 proximate to the ADC 17A may be an end at which the wiring 122 connected to the TSV array 102 is provided.

With such an arrangement, for example, the ADC 17A, the signal processor 13, and the DSP 14 are arranged in order from the upstream side along the flow of a signal read out from the pixel array 101, where the upstream side is the vicinity of the wiring 122 connected to the TSV array 102, in the same manner as in the foregoing embodiments. The wiring connecting the parts therefore can be shortened.

Consequently, transmission load is reduced, leading to reduction in signal delay and less consumption power.

3.2 Operation Effects

As described above, when the first substrate 300 and the second substrate 320 are downsized in accordance with the size of the pixel array 101, the ADC 17A and the DSP 14 are spaced apart from each other, thereby reducing noise propagating from the DSP 14 to the ADC 17A. Consequently, reduction in quality of an image acquired by the image sensor 10 can be suppressed.

The other configuration and effects are similar to those of the foregoing embodiments and will not be further elaborated here.

4. Application to Other Sensors

In the foregoing embodiments, the technique according to the present disclosure is applied to a solid-state imaging device (image sensor 10) that acquires a two-dimensional image. However, the application of the technique according to the present disclosure is not limited to a solid-state imaging device. For example, the technique according to the present disclosure can be applied to a variety of light-receiving sensors such as Time of Flight (ToF) sensors, infrared (IR) sensors, and dynamic vision sensors (DVS). That is, when the chip structure of light-receiving sensors is of the stacked type, reduction of noise included in sensor results and miniaturization of sensor chips can be achieved.

5. Application to Movable Body

The technique according to the present disclosure (the present technique) is applicable to a variety of products. For example, the technique according to the present disclosure may be implemented as a device mounted on any type of movable bodies, such as automobiles, electric vehicles, hybrid electric vehicles, motorcycles, bicycles, personal mobility devices, airplanes, drones, vessels and ships, and robots.

Figure 18:
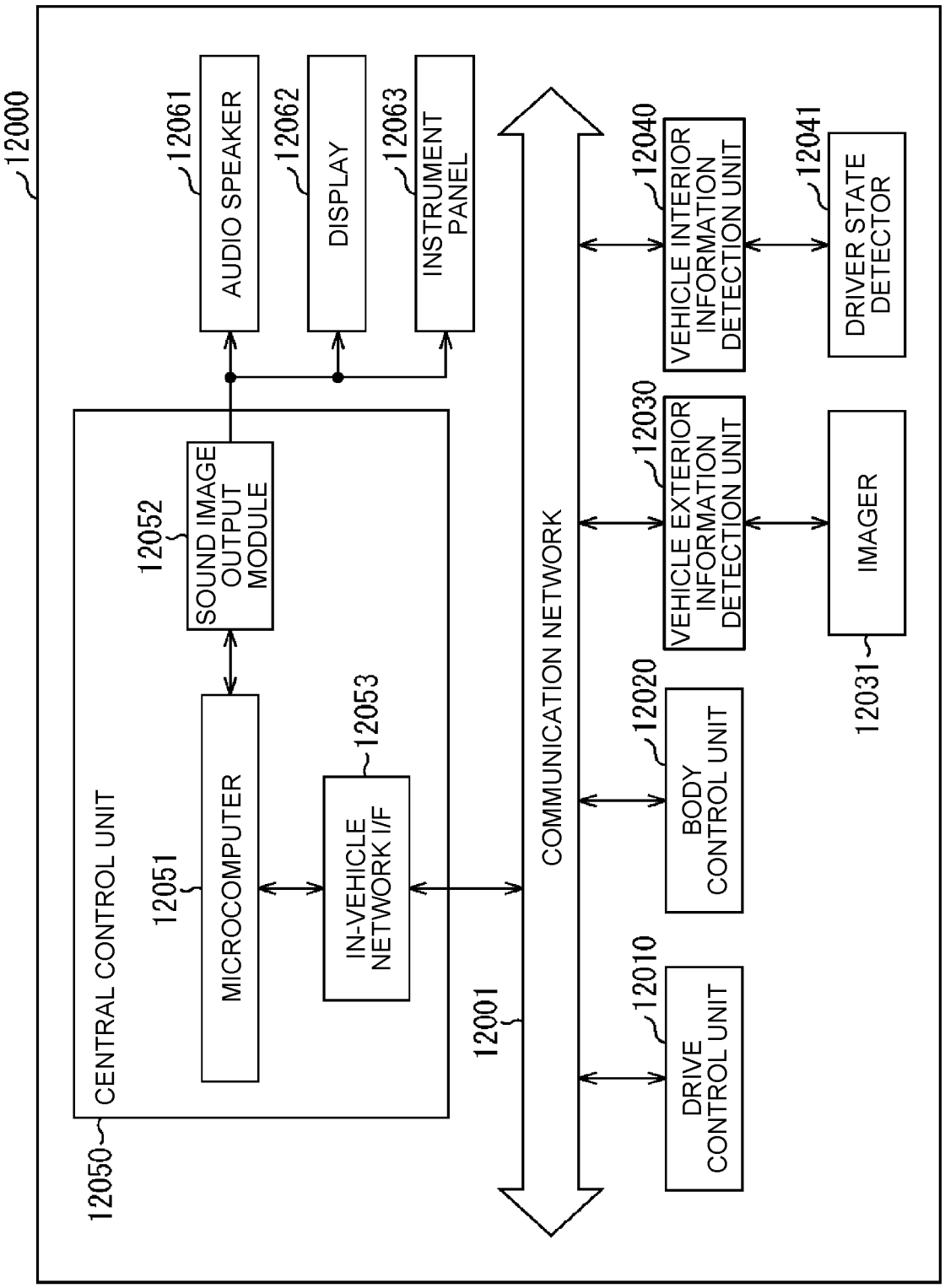
FIG. 18 is a block diagram illustrating an example of the overall configuration of a vehicle control system.

FIG. 18 is a block diagram illustrating an example of the overall configuration of a vehicle control system that is an example of a movable body control system to which the technique according to the present disclosure is applicable.

A vehicle control system 12000 includes a plurality of electronic control units connected through a communication network 12001. In the example illustrated in FIG. 18, the vehicle control system 12000 includes a drive control unit 12010, a body control unit 12020, a vehicle exterior information detection unit 12030, a vehicle interior information detection unit 12040, and a central control unit 12050. As a functional configuration of the central control unit 12050, a microcomputer 12051, a sound image output module 12052, and an in-vehicle network I/F (interface) 12053 are illustrated.

The drive control unit 12010 controls operation of devices related to a drive system of a vehicle in accordance with a variety of computer programs. For example, the drive control unit 12010 functions as a control device for a drive force generating device for generating drive force of the vehicle, such as an internal combustion engine or a drive motor, a drive force transmission mechanism for transmitting drive force to the wheels, a steering mechanism for adjusting the steering angle of the vehicle, and a braking device for generating braking force of the vehicle.

The body control unit 12020 controls operation of a variety of devices installed in the vehicle body in accordance with a variety of computer programs. For example, the body control unit 12020 functions as a control device for a keyless entry system, a smart key system, a power window device, or a variety of lamps such as head lamps, rear lamps, brake lamps, turn signals, and fog lamps. In this case, the body control unit 12020 may receive radio waves transmitted from a portable device alternative to a key or signals from a variety of switches. The body control unit 12020 accepts input of the radio waves or signals and controls a door lock device, a power window device, a lamp, and the like of the vehicle.

The vehicle exterior information detection unit 12030 detects information on the outside of the vehicle equipped with the vehicle control system 12000. For example, an imager 12031 is connected to the vehicle exterior information detection unit 12030. The vehicle exterior information detection unit 12030 allows the imager 12031 to capture an image of the outside of the vehicle and receives the captured image. The vehicle exterior information detection unit 12030 may perform an object detection process or a distance detection process for persons, vehicles, obstacles, signs, or characters on roads, based on the received image.

The imager 12031 is an optical sensor that receives light and outputs an electrical signal corresponding to the quantity of received light of the light. The imager 12031 may output an electrical signal as an image or output as information on a measured distance. Light received by the imager 12031 may be visible light or invisible light such as infrared rays.

The vehicle interior information detection unit 12040 detects information on the inside of the vehicle. The vehicle interior information detection unit 12040 is connected to, for example, a driver state detector 12041 that detects a state of the driver. The driver state detector 12041 includes, for example, a camera for taking an image of the driver, and the vehicle interior information detection unit 12040 may calculate the degree of fatigue or the degree of concentration of the driver or may determine whether the driver falls asleep, based on detection information input from the driver state detector 12041.

The microcomputer 12051 can compute a control target value for the drive force generating device, the steering mechanism, or the braking device, based on information on the inside and outside of the vehicle acquired by the vehicle exterior information detection unit 12030 or the vehicle interior information detection unit 12040, and output a control command to the drive control unit 12010. For example, the microcomputer 12051 can perform coordination control for the purpose of function implementation of advanced driver assistance systems (ADAS), including collision avoidance or shock mitigation of the vehicle, car-following drive based on the distance between vehicles, vehicle speed-keeping drive, vehicle collision warning, and lane departure warning.

The microcomputer 12051 can perform coordination control for the purpose of, for example, autonomous driving, in which the drive force generating device, the steering mechanism, or the braking device is controlled based on information on the surroundings of the vehicle acquired by the vehicle exterior information detection unit 12030 or the vehicle interior information detection unit 12040 to enable autonomous driving without depending on the operation by the driver.

The microcomputer 12051 can output a control command to the body control unit 12030, based on information on the outside of the vehicle acquired by the vehicle exterior information detection unit 12030. For example, the microcomputer 12051 can perform coordination control for the antidazzle purpose, for example, by controlling the head lamps in accordance with the position of a vehicle ahead or an oncoming vehicle detected by the vehicle exterior information detection unit 12030 to switch high beams to low beams.

The sound image output module 12052 transmits an output signal of at least one of sound and image to an output device capable of visually or aurally giving information to a passenger in the vehicle or the outside of the vehicle. In the example in FIG. 18, an audio speaker 12061, a display 12062, and an instrument panel 12063 are illustrated as the output device. The display 12062 may include, for example, at least one of an on-board display and a head-up display.

Figure 19:
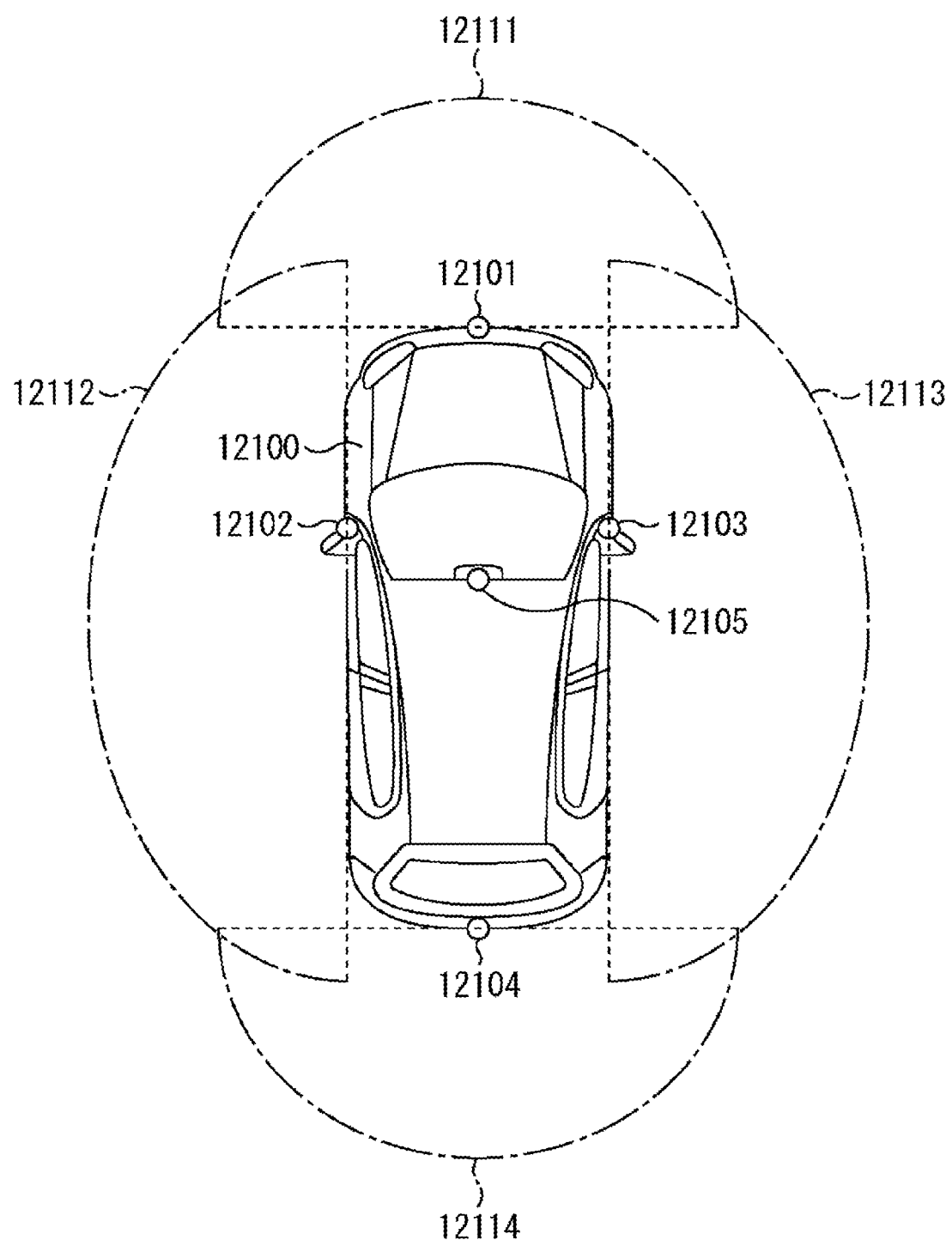
FIG. 19 is a diagram illustrating an example of the installation position of a vehicle exterior information detector and an imager.

FIG. 19 is a diagram illustrating an example of the installation position of the imager 12031.

In FIG. 19, imagers 12101, 12102, 12103, 12104, and 12105 are provided as the imager 12031.

The imagers 12101, 12102, 12103, 12104, and 12105 are provided, for example, at positions such as front nose, side mirrors, rear bumper, back door of the vehicle 12100, and an upper portion of the front glass inside the vehicle. The imager 12101 provided at the front nose and the imager 12105 provided at the upper portion of the front glass inside the vehicle mainly acquire an image in front of the vehicle 12100. The imagers 12102 and 12103 provided at the side mirrors mainly acquire images on the sides of the vehicle 12100. The imager 12104 provided at the rear bumper or the back door mainly acquires an image behind the vehicle 12100. The imager 12105 provided at the upper portion of the front glass in the vehicle interior is mainly used for detecting a vehicle ahead, pedestrians, obstacle, traffic signs, road signs, traffic lanes, and the like.

FIG. 19 illustrates an example of the imaging ranges of the imagers 12101 and 12104. An imaging range 12111 indicates an imaging range of the imager 12101 provided at the front nose, imaging ranges 12112 and 12113 indicate the imaging ranges of the imagers 12102 and 12103 provided at the side mirrors, and an imaging range 12114 indicates the imaging range of the imager 12104 provided at the rear bumper or the back door. For example, a bird's eye view of the vehicle 12100 viewed from above can be obtained by superimposing image data captured by the imagers 12101 and 12104.

At least one of the imagers 12101 and 12104 may have a function of acquiring distance information. For example, at least one of the imagers 12101 and 12104 may be a stereo camera including a plurality of image sensors or may be an image sensor having a pixel for phase difference detection.

For example, the microcomputer 12051 can obtain the distance to a three-dimensional object within the imaging range 12111 or 12114 and a temporal change of this distance (relative speed to the vehicle 12100), based on distance information obtained from the imager 12101 or 12104, to specifically extract a three-dimensional object closest to the vehicle 12100 on the path of travel and traveling at a predetermined speed (for example, 0 km/h or more) in substantially the same direction as the vehicle 12100, as a vehicle ahead. In addition, the microcomputer 12051 can preset a distance between vehicles to be kept in front of a vehicle ahead and perform, for example, automatic braking control (including car-following stop control) and automatic speed-up control (including car-following startup control). In this way, coordination control can be performed, for example, for the purpose of autonomous driving in which the vehicle runs autonomously without depending on the operation by the driver.

For example, the microcomputer 12051 can classify three-dimensional object data on a three-dimensional object into two-wheel vehicle, standard-sized vehicle, heavy vehicle, pedestrian, utility pole, or any other three-dimensional object, based on the distance information obtained from the imager 12101 or 12104, and can use the extracted data for automatic avoidance of obstacles. For example, the microcomputer 12051 identifies an obstacle in the surroundings of the vehicle 12100 as an obstacle visible to the driver of the vehicle 12100 or as an obstacle hardly visible. The microcomputer 12051 then determines a collision risk indicating the degree of risk of collision with each obstacle and, when the collision risk is equal to or higher than a setting value and there is a possibility of collision, outputs an alarm to the driver through the audio speaker 12061 or the display 12062, or performs forced deceleration or avoidance steering through the drive control unit 12010, thereby implementing drive assistance for collision avoidance.

At least one of the imagers 12101 and 12104 may be an infrared camera that detects infrared rays. For example, the microcomputer 12051 can recognize a pedestrian by determining whether a pedestrian exists in the captured image by the imager 12101 or 12104. Such recognition of pedestrians is performed, for example, through the procedure of extracting feature points in the captured image by the imager 12101 or 12104 serving as an infrared camera and the procedure of performing pattern matching with a series of feature points indicating the outline of an object to determine whether the object is a pedestrian. When the microcomputer 12051 determines that a pedestrian exists in the captured image by the imager 12101 or 12104 and recognizes a pedestrian, the sound image output module 12052 controls the display 12062 such that a rectangular outline for highlighting the recognized pedestrian is superimposed. The sound image output module 12052 may control the display 12062 such that an icon indicating a pedestrian appears at a desired position.

An example of the vehicle control system to which the technique according to the present disclosure is applicable has been described above. The technique according to the present disclosure is applicable to the imager 12031 and the like in the configuration described above. When the technique according to the present disclosure is applied to the imager 12031 and the like, miniaturization of the imager 12031 and the like can be achieved, thereby facilitating design of the interior and the exterior of the vehicle 12100. When the technique according to the present disclosure is applied to the imager 12031 and the like, a clear image with reduced noise can be acquired to provide a driver with a more visible image. Consequently, the driver's fatigue can be alleviated.

6. Application to Endoscopic Surgery System

The technique according to the present disclosure (the present technique) is applicable to a variety of products. For example, the technique according to the present disclosure may be applied to an endoscopic surgery system.

Figure 20:
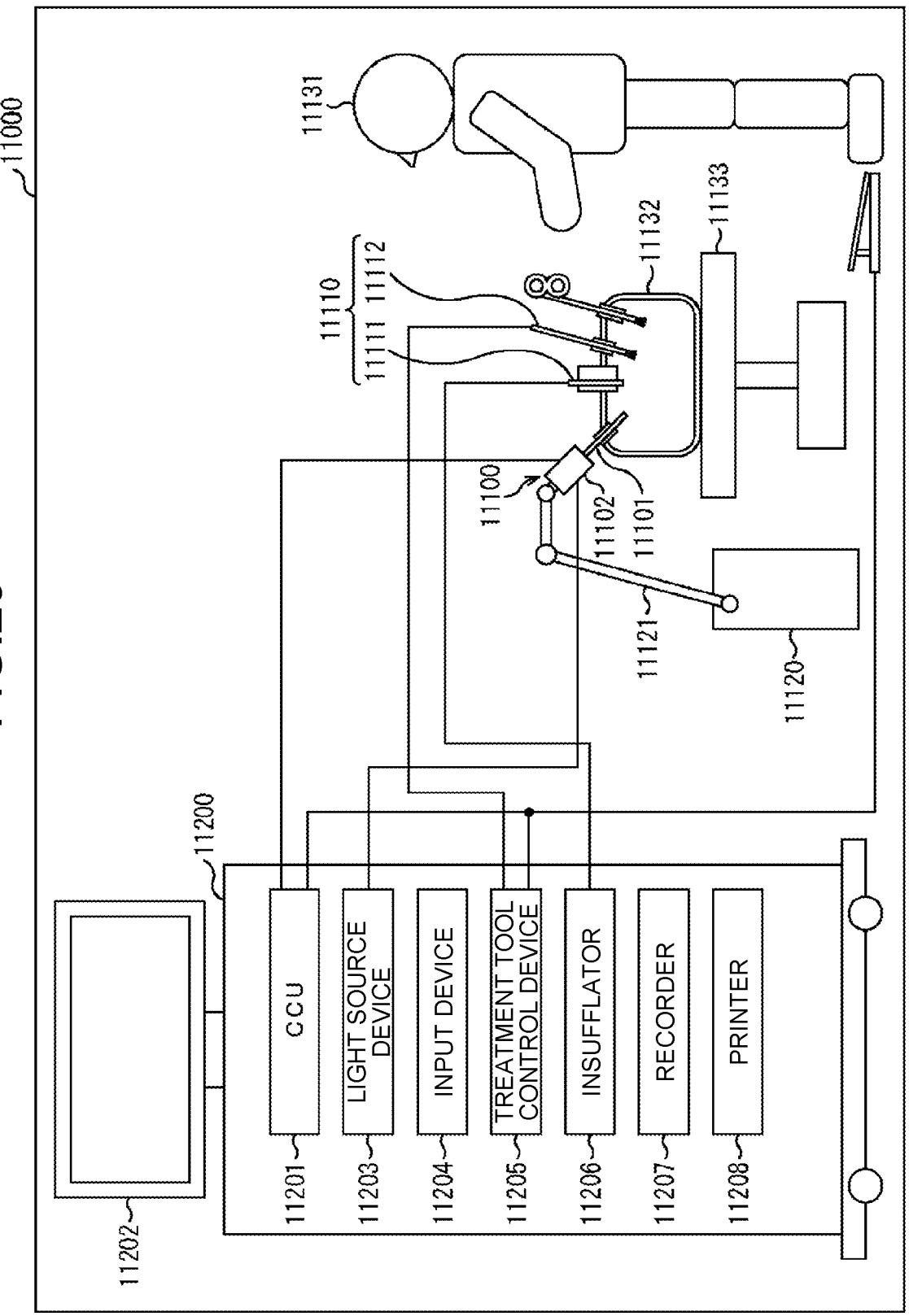
FIG. 20 is a diagram illustrating an example of the overall configuration of an endoscopic surgery system.

FIG. 20 is a diagram illustrating an example of the overall configuration of an endoscopic surgery system to which the technique according to the present disclosure (the present technique) is applicable.

FIG. 20 illustrates a situation in which an operator (doctor) 11131 uses an endoscopic surgery system 11000 to perform an operation on a patient 11132 on a patient bed 11133. As illustrated in the drawing, the endoscopic surgery system 11000 includes an endoscope 11100, other surgical instruments 11110 such as an insufflation tube 11111 and an energy treatment tool 11112, a support arm device 11120 supporting the endoscope 11100, and a cart 11200 carrying a variety of devices for endoscopic surgery.

The endoscope 11100 includes a barrel 11101 having a region of a predetermined length from its tip end to be inserted into the body cavity of the patient 11132, and a camera head 11102 connected to the base end of the barrel 11101. In the example illustrated in the drawing, the endoscope 11100 is a rigid borescope having a rigid barrel 11101. However, the endoscope 11100 may be configured as a soft borescope having a soft barrel.

The tip end of the barrel 11101 has an opening having an objective lens fitted therein. A light source device 11203 is connected to the endoscope 11100. Light generated by the light source device 11203 is propagated to the tip end of the barrel through a light guide extending inside the barrel 11101 and irradiates an observation target in the body cavity of the patient 11132 through the objective lens. The endoscope 11100 may be a forward-viewing endoscope or may be a forward-oblique viewing endoscope or a side-viewing endoscope.

An optical system and an image sensor are provided inside the camera head 11102. Reflected light (observation light) from an observation target is collected by the optical system onto the image sensor. The observation light is converted to electricity by the image sensor to generate an electrical signal corresponding to the observation light, that is, an image signal corresponding to an observation image. The image signal is transmitted as RAW data to a camera control unit (CCU) 11201.

The CCU 11201 is configured with a central processing unit (CPU), a graphics processing unit (GPU), or the like to centrally control the operation of the endoscope 11100 and a display device 11202. The CCU 11201 receives an image signal from the camera head 11102 and performs a variety of image processing on the image signal, for example, a development process (demosaicing) for displaying an image based on the image signal.

The display device 11202 displays an image based on the image signal subjected to image processing by the CCU 11201, under the control of the CCU 11201.

The light source device 11203 is configured with a light source such as a light emitting diode (LED) and supplies the endoscope 11100 with radiation light in imaging a surgery site.

An input device 11204 is an input interface with the endoscopic surgery system 11000. The user can input a variety of information and instructions to the endoscopic surgery system 11000 through the input device 11204. For example, the user inputs an instruction to change the imaging conditions by the endoscope 11100 (the kind of radiation light, magnification, focal length, etc.).

A treatment tool control device 11205 controls actuation of the energy treatment tool 11112 for cauterization of tissues, incision, or sealing of blood vessels. An insufflator 11206 feeds gas into the body cavity through the insufflation tube 11111 to insufflate the body cavity of the patient 11132 in order to ensure the field of view with the endoscope 11100 and ensure a working space for the operator. A recorder 11207 is a device capable of recording a variety of information on surgery. A printer 11208 is a device capable of printing a variety of information on surgery in a variety of forms such as text, image, or graph.

The light source device 11203 that supplies the endoscope 11100 with radiation light in imaging a surgery site can be configured with, for example, a white light source such as an LED, a laser light source, or a combination thereof. When a white light source is configured with a combination of RGB laser light sources, the output power and the output timing of each color (each wavelength) can be controlled accurately, and, therefore, the white balance of the captured image can be adjusted in the light source device 11203. In this case, an observation target is irradiated time-divisionally with laser light from each of the RGB laser light sources, and actuation of the image sensor in the camera head 11102 is controlled in synchronization with the radiation timing, whereby an image corresponding to each of R, G, and B can be captured time-divisionally. According to this method, a color image can be obtained even without color filters in the image sensor.

The actuation of the light source device 11203 may be controlled such that the intensity of output light is changed every certain time. In synchronization with the timing of changing the intensity of light, the actuation of the image sensor in the camera head 11102 is controlled to acquire images time-divisionally, and the images are combined to generate an image with a high dynamic range free from blocked-up shadows and blown out highlights.

The light source device 11203 may be configured to supply light in a predetermined wavelength band corresponding to specific light observation. In specific light observation, for example, narrow band imaging is performed, which uses the wavelength dependency of light absorption in body tissues and applies light in a narrow band, compared with radiation light (that is, white light) in normal observation, to capture an image of predetermined tissues such as blood vessels in the outermost surface of mucosa. Alternatively, in specific light observation, fluorescence observation may be performed in which an image is acquired by fluorescence generated by radiation of excitation light. In fluorescence observation, for example, excitation light is applied to body tissues and fluorescence from the body tissues is observed (autofluorescence imaging), or a reagent such as indocyanine green (ICG) is locally injected to body tissues and excitation light corresponding to the fluorescence wavelength of the reagent is applied to the body tissues to obtain a fluorescence image. The light source device 11203 may be configured to supply narrow-band light and/or excitation light corresponding to such specific light observation.

Figure 21:
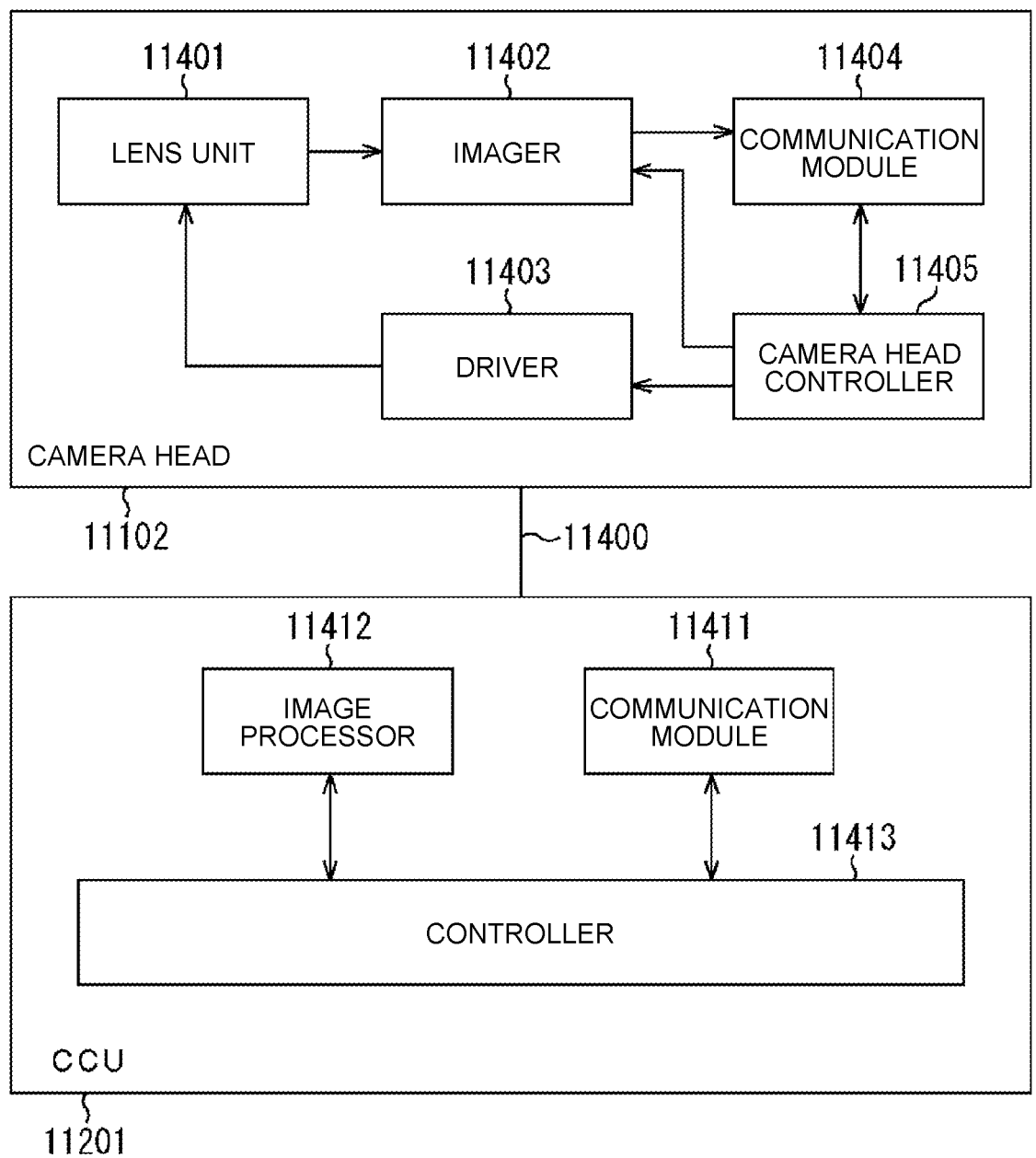
FIG. 21 is a block diagram illustrating an example of the functional configuration of a camera head and a CCU.

FIG. 21 is a block diagram illustrating an example of the functional configuration of the camera head 11102 and the CCU 11201 illustrated in FIG. 20.

The camera head 11102 includes a lens unit 11401, an imager 11402, a driver 11403, a communication module 11404, and a camera head controller 11405. The CCU 11201 includes a communication module 11411, an image processor 11412, and a controller 11413. The camera head 11102 and the CCU 11201 are connected to communicate with each other through a transmission cable 11400.

The lens unit 11401 is an optical system provided at a connection portion to the barrel 11101. Observation light taken in from the tip end of the barrel 11101 is propagated to the camera head 11102 and enters the lens unit 11401. The lens unit 11401 is configured with a combination of a plurality of lenses including a zoom lens and a focus lens.

The imager 11402 may be configured with one image sensor (called single sensor-type) or a plurality of image sensors (called multi sensor-type). When the imager 11402 is a multi-sensor construction, for example, image signals corresponding to R, G, and B may be generated by image sensors and combined to produce a color image. Alternatively, the imager 11402 may have a pair of image sensors for acquiring image signals for right eye and for left eye corresponding to three-dimensional (3D) display. The 3D display enables the operator 11131 to more accurately grasp the depth of living tissues in a surgery site. When the imager 11402 is a multi-sensor construction, several lines of lens units 11401 may be provided corresponding to the image sensors.

The imager 11402 is not necessarily provided in the camera head 11102. For example, the imager 11402 may be provided immediately behind the objective lens inside the barrel 11101.

The driver 11403 is configured with an actuator and moves the zoom lens and the focus lens of the lens unit 11401 by a predetermined distance along the optical axis under the control of the camera head controller 11405. The magnification and the focal point of a captured image by the imager 11402 thus can be adjusted as appropriate.

The communication module 11404 is configured with a communication device for transmitting/receiving a variety of information to/from the CCU 11201. The communication module 11404 transmits an image signal obtained from the imager 11402 as RAW data to the CCU 11201 through the transmission cable 11400.

The communication module 11404 receives a control signal for controlling actuation of the camera head 11102 from the CCU 11201 and supplies the received signal to the camera head controller 11405. The control signal includes, for example, information on imaging conditions, such as information specifying a frame rate of the captured images, information specifying an exposure value in imaging, and/or information specifying a magnification and a focal point of the captured image.

The image conditions such as frame rate, exposure value, magnification, and focal point may be specified as appropriate by the user or may be automatically set by the controller 11413 of the CCU 11201 based on the acquired image signal. In the latter case, the endoscope 11100 is equipped with an auto exposure (AE) function, an auto focus (AF) function, and an auto white balance (AWB) function.

The camera head controller 11405 controls actuation of the camera head 11102, based on a control signal received from the CCU 11201 through the communication module 11404.

The communication module 11411 is configured with a communication device for transmitting/receiving a variety of information to/from the camera head 11102. The communication module 11411 receives an image signal transmitted from the camera head 11102 through the transmission cable 11400.

The communication module 11411 transmits a control signal for controlling actuation of the camera head 11102 to the camera head 11102. The image signal and the control signal can be transmitted via electrical communication or optical communication.

The image processor 11412 performs a variety of image processing on the image signal that is RAW data transmitted from the camera head 11102.

The controller 11413 performs a variety of control on imaging of a surgery site and the like by the endoscope 11100 and display of a captured image obtained by imaging of a surgery site and the like. For example, the controller 11413 generates a control signal for controlling actuation of the camera head 11102.

The controller 11413 displays a captured image visualizing a surgery site and the like on the display device 11202, based on the image signal subjected to image processing by the image processor 11412. In doing so, the controller 11413 may recognize a variety of objects in the captured image using a variety of image recognition techniques. For example, the controller 11413 detects the shape of edge, color, and the like of an object included in the captured image to recognize a surgical instrument such as forceps, a specific living body site, bleeding, and mist in use of the energy treatment tool 11112. When displaying the captured image on the display device 11202, the controller 11413 may use the recognition result to superimpose a variety of surgery assisting information on the image of the surgery site. The surgery assisting information superimposed and presented to the operator 11131 can alleviate burden on the operator 11131 or ensure the operator 11131 to proceed surgery.

The transmission cable 11400 connecting the camera head 11102 and the CCU 11201 is an electrical signal cable corresponding to communication of electrical signals, an optical fiber corresponding to optical communication, or a composite cable thereof.

In the example illustrated in the drawing, the transmission cable 11400 is used for wired communication. However, communication between the camera head 11102 and the CCU 11201 may be wireless.

An example of the endoscopic surgery system to which the technique according to the present disclosure is applicable has been described above. The technique according to the present disclosure is applicable to, for example, the imager 11402 and the like in the camera head 11102. When the technique according to the present disclosure is applied to the camera head 11102, the camera head 11102 and the like can be miniaturized, resulting in the compact endoscopic surgery system 11000. When the technique according to the present disclosure is applied to the camera head 11102 and the like, a clear image with reduced noise can be acquired to provide the operator with a more visible image. Consequently, the operator's fatigue can be alleviated.

Although the endoscopic surgery system has been described here by way of example, the technique according to the present disclosure may be applied to, for example, a microscopic surgery system.

7. Application to Whole Slide Imaging (WSI) System

The technique according to the present disclosure is applicable to a variety of products. For example, the technique according to the present disclosure may be applied to a pathology diagnosis system to allow doctors to diagnose pathological changes by observing cells and tissues sampled from patients, and an assistance system therefor (hereinafter referred to as diagnostic assistance system). This diagnostic assistance system may be a whole slide imaging (WSI) system for diagnosing pathological changes based on an image acquired using digital pathology technology, and assisting the diagnosis.

Figure 22:
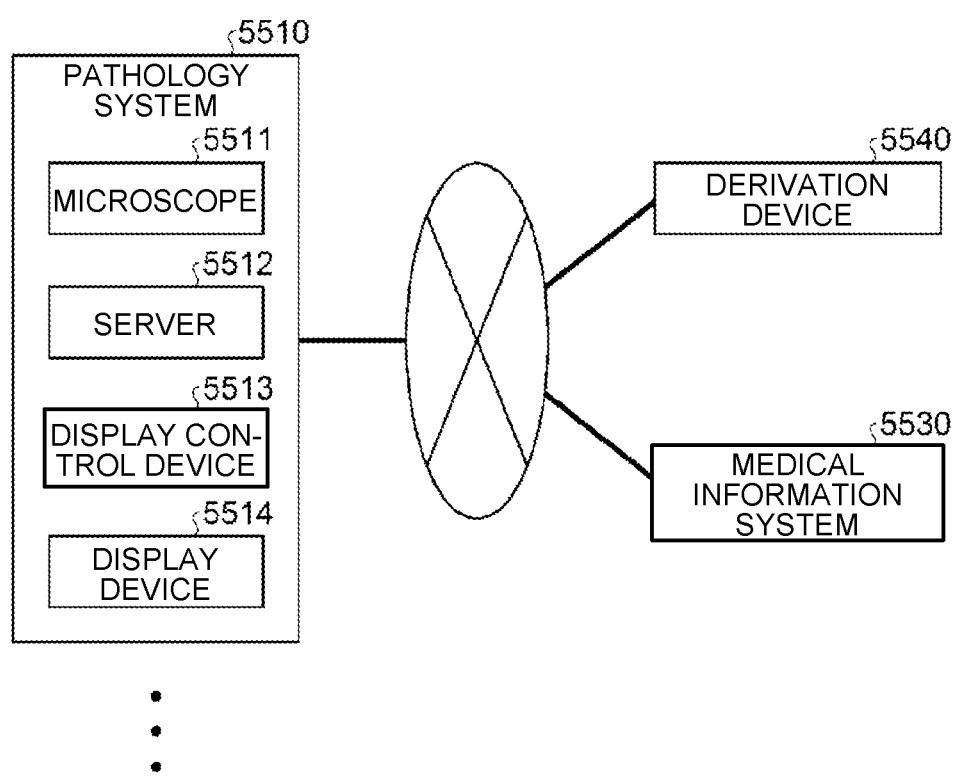
FIG. 22 is a block diagram illustrating an example of the overall configuration of a diagnostic assistance system.

FIG. 22 is a diagram illustrating an example of the overall configuration of a diagnostic assistance system 5500 to which the technique according to the present disclosure is applied. As illustrated in FIG. 22, the diagnostic assistance system 5500 includes one or more pathology systems 5510. The diagnostic assistance system 5500 may further include a medical information system 5530 and a derivation device 5540.

Each of one or more pathology systems 5510 is a system mainly used by pathologists and introduced into, for example, a research laboratory or a hospital. The pathology systems 5510 may be introduced into different hospitals and are connected to the medical information system 5530 and the derivation device 5540 through a variety of networks such as wide area networks (WANs) (including the Internet), local area networks (LAN), public networks, and mobile communication networks.

Each pathology system 5510 includes a microscope 5511, a server 5512, a display control device 5513, and a display device 5514.

The microscope 5511 has the function of an optical microscope and captures an image of an observation target on a glass slide to acquire a pathological image that is a digital image. The observation target is, for example, tissues or cells sampled from a patient and may be a piece of organ, saliva, or blood.

The server 5512 stores and saves the pathological image acquired by the microscope 5511 into a not-illustrated storage unit. When accepting an inspection request from the display control device 5513, the server 5512 searches the not-illustrated storage unit for a pathological image and sends the retrieved pathological image to the display control device 5513.

The display control device 5513 sends an inspection request for a pathological image accepted from the user to the server 5512. The display control device 5513 then displays the pathological image accepted from the server 5512 on the display device 5514 using liquid crystal, electro-luminescence (EL), cathode ray tube (CRT), or the like. The display device 5514 may support 4K or 8K, and one or more display devices 5514 may be provided.

Here, when the observation target is a solid matter such as a piece of organ, the observation target may be, for example, a stained slice. The slice may be prepared, for example, by slicing a block cut out from a specimen such as an organ. When slicing, the block may be fixed by, for example, paraffin.

In staining the slice, a variety of staining can be employed, such as common staining such as hematoxylin-eosin (HE) staining for defining the form of tissue, and immunostaining such as immunohistochemistry (IHC) for identifying the immune state of tissue. In doing so, one slice may be stained using different kinds of reagents, or two or more slices (also referred to as adjacent slices) continuously cut out from the same block may be stained using different reagents.

The microscope 5511 may include a low-resolution imager for capturing an image at low resolution and a high-resolution imager for capturing an image at high resolution. The low-resolution imager and the high-resolution imager may be different optical systems or the same optical system. In the case of the same optical system, the microscope 5511 may have a resolution changed according to an imaging target.

A glass slide having an observation target is placed on a stage positioned in the angle of view of the microscope 5511. The microscope 5511 first acquires the entire image in the angle of view using the low-resolution imager and specifies the region of the observation target from the acquired entire image. Subsequently, the microscope 5511 divides the region including the observation target into a plurality of division regions with a predetermined size and successively captures images of the division regions using the high-resolution imager to acquire high-resolution images of the division regions. In switching the target division regions, the stage may be moved, the imaging optical system may be moved, or both may be moved. Each division region may be overlapped with the adjacent division region in order to prevent occurrence of an imaging-missed region due to unintended slippage of the glass slide. The entire image may include identification information for associating the entire image with the patient. Examples of the identification information include a character string and a QR code (registered trademark).

The high-resolution images acquired by the microscope 5511 are input to the server 5512. The server 5512 divides each high-resolution image into partial images (hereinafter referred to as tile images) with a smaller size. For example, the server 5512 vertically and horizontally divides one high-resolution image into 10×10, in total, 100 tile images. In doing so, if adjacent division regions are overlapping, the server 5512 may perform a stitching process for the high-resolution images adjacent to each other using such technology as template matching. In this case, the server 5512 may divide the stitched high-resolution images as a whole to generate tile images. However, the generation of tile images from a high-resolution image may precede the stitching process.

The server 5512 may further divide a tile image to generate tile images with a smaller size. The generation of such tile images may be repeated until a tile image set as a minimum unit is generated.

Upon generating a tile image as a minimum unit, the server 5512 executes a tile combining process for all the tile images to combine a predetermined number of adjacent tile images and generate one tile image. This tile combining process may be repeated until finally one tile image is generated. Through such a process, a tile image group having a pyramid structure is generated, in which each layer is configured with one or more tile images. In this pyramid structure, a tile image on a certain layer and a tile image on a layer different from this layer have the same pixel count, but their resolutions are different. For example, when 2×2, in total, four tile images are combined into one tile image on a higher layer, the resolution of the tile image on the higher layer is half the resolution of the tile images on the lower layer used in combining.

When such a tile image group having a pyramid structure is constructed, the level of detail of the observation target appearing on the display device can be changed according to the layer to which a tile image to be displayed belongs to. For example, when the tile image on the lowest layer is used, a narrow region of the observation target is displayed in detail, and as the tile image on a higher layer is used, a wider region of the observation target is displayed coarsely.

The generated tile image group having a pyramid structure is, for example, stored into a not-illustrated storage unit together with identification information uniquely identifying each tile image (referred to as tile identification information). When accepting an acquisition request for a tile image including tile identification information from another device (for example, the display control device 5513 or the derivation device 5540), the server 5512 transmits the tile image corresponding to the tile identification information to another device.

The tile image that is a pathological image may be generated for each imaging condition such as focal length and staining condition. When a tile image is generated for each imaging condition, a certain pathological image as well as another pathological image corresponding to an imaging condition different from a certain imaging condition and in the same region as the certain pathological image may be displayed side by side. The certain imaging condition may be designated by an inspector. When the inspector designates a plurality of imaging conditions, pathological images in the same region corresponding to the respective imaging conditions may be displayed side by side.

The server 5512 may store the tile image group having a pyramid structure into a storage device other than the server 5512, for example, a cloud server. A part or the whole of the tile image generating process as described above may be performed, for example, by a cloud server.

The display control device 5513 extracts a desired tile image from the tile image group having a pyramid structure in accordance with input operation from the user and outputs the same to the display device 5514. Through such a process, the user can attain a sense of viewing the observation target while changing the observation magnification. That is, the display control device 5513 functions as a virtual microscope. The virtual observation magnification here actually corresponds to a resolution.

High-resolution images can be captured by any methods. A high-resolution image may be acquired by capturing images of division regions while repeating stop and move of the stage, or a high-resolution image on a strip may be acquired by capturing images of division regions while moving the stage at a predetermined speed. The process of generating tile images from a high-resolution image is not an essential configuration, and the resolution of the stitched high-resolution images as a whole may be changed stepwise to generate an image with resolution changing stepwise. Also in this case, a low-resolution image in a wide area to a high-resolution image in a narrow area can be presented stepwise to the user.

The medical information system 5530 is an electronic health record system and stores information related to diagnosis, such as information identifying patients, disease information of patients, examination information and image information used in diagnosis, diagnosis results, and prescribed drugs. For example, a pathological image obtained by imaging an observation target of a patient may be stored once through the server 5512 and thereafter displayed on the display device 5514 by the display control device 5513. The pathologist using the pathology system 5510 conducts pathology diagnosis based on the pathological image appearing on the display device 5514. The result of pathology diagnosis conducted by the pathologist is stored into the medical information system 5530.

The derivation device 5540 may perform analysis of a pathological image. In this analysis, a learning model created by machine learning can be used. The derivation device 5540 may derive the classification result of a certain region, the identification result of tissues, and the like, as the analysis result. The derivation device 5540 may further derive the identification result such as cell information, count, position, and brightness information, scoring information therefor, and the like. These pieces of information derived by the derivation device 5540 may be displayed as diagnostic assistance information on the display device 5514 of the pathology system 5510.

The derivation device 5540 may be a server system including one or more servers (including a cloud server). The derivation device 5540 may be a configuration incorporated into, for example, the display control device 5513 or the server 5512 in the pathology system 5510. That is, a variety of analysis for a pathological image may be performed in the pathology system 5510.

The technique according to the present disclosure may be preferably applied, for example, to the microscope 5511 among the configurations described above. Specifically, the technique according to the present disclosure can be applied to the low-resolution imager and/or the high-resolution imager in the microscope 5511. The application of the technique according to the present disclosure to the low-resolution imager and/or the high-resolution imager leads to miniaturization of the low-resolution imager and/or the high-resolution imager, and thus miniaturization of the microscope 5511. The miniaturization facilitates transportation of the microscope 5511 and thereby facilitates system introduction and system replacement. In addition, when the technique according to the present disclosure is applied to the low-resolution imager and/or the high-resolution imager, a part or the whole of the process from acquisition of a pathological image to analysis of the pathological image can be performed on the fly in the microscope 5511, so that diagnostic assistance information can be output more promptly and appropriately.

The configuration described above is not limited to a diagnostic assistance system and may be applied generally to biological microscopes such as a confocal microscope, a fluorescent microscope, and a video microscope. Here, the observation target may be a biological sample such as cultured cell, fertilized egg, and sperm, a biological material such as cell sheet and three-dimensional cell tissue, and a living body such as zebrafish and mouse. The observation target may be observed in a microplate or a petri dish, rather than on a glass slide.

A moving image may be generated from still images of the observation target acquired using the microscope. For example, a moving image may be generated from still images captured successively for a predetermined period of time, or an image sequence may be generated from still images captured at predetermined intervals. With a moving image generated from still images, dynamic features of an observation target, such as motion such as pulsation, expansion, and migration of cancer cell, nerve cell, cardiac muscle tissue, sperm, and the like, and a division process of cultured cell and fertilized egg, can be analyzed using machine learning.

Although embodiments of the present disclosure have been described above, the technical scope of the present disclosure is not limited to the foregoing embodiments as they are and may be susceptible to various modifications without departing from the spirit of the present disclosure. The constituent elements in different embodiments and modifications may be combined as appropriate.

The effects in the embodiments described in the present description are only by way of illustration and are not intended to be limitative, and any other effects may be achieved.

The foregoing embodiments may be used singly or may be used in combination with other embodiments.

The present technique may employ the configuration as follows.

(1)

A stacked light-receiving sensor comprising:

a first substrate; and a second substrate bonded to the first substrate, the first substrate including a pixel array in which a plurality of unit pixels are arranged in a two-dimensional matrix, the second substrate including a converter configured to convert an analog pixel signal output from the pixel array to digital image data and a processing unit configured to perform a process based on a neural network calculation model for data based on the image data, wherein at least a part of the converter is disposed on a first side in the second substrate, and the processing unit is disposed on a second side opposite to the first side in the second substrate.

(2)

The stacked light-receiving sensor according to the (1), wherein the neural network calculation model is designed based on a parameter generated by inputting, to a predetermined machine learning model, training data in which an input signal corresponding to output of the pixel array is associated with a label for the input signal.

(3)

The stacked light-receiving sensor according to the (2), wherein the predetermined machine learning model is a multi-level neural network model.

(4)

The stacked light-receiving sensor according to any one of the (1) to (3), wherein the data based on the image data is the image data read out from the pixel array or image data with a data size reduced by decimating pixels of the image data.

(5)

The stacked light-receiving sensor according to any one of the (1) to (4), wherein the first substrate includes connection wiring on a third side corresponding to the first side of the second substrate in a state in which the first substrate and the second substrate are bonded together, the connection wiring electrically connecting the pixel array to the converter.

(6)

The stacked light-receiving sensor according to the (5), wherein the connection wiring is a through silicon via (TSV) passing through the first substrate.

(7)

The stacked light-receiving sensor according to the (5), wherein the second substrate has connection wiring on the first side, the connection wiring being electrically connected to the converter, and the connection wiring of the first substrate and the connection wiring of the second substrate are directly joined by metal joint.

(8)

The stacked light-receiving sensor according to any one of the (1) to (7), wherein the second substrate further includes a signal processor configured to perform signal processing for the image data, and the signal processor is disposed between the converter and the processing unit in the second substrate.

(9)

The stacked light-receiving sensor according to any one of the (1) to (8), wherein the second substrate further includes a memory to store data, and the memory is disposed in a region adjacent to the processing unit in the second substrate.

(10)

The stacked light-receiving sensor according to the (9), wherein the memory is disposed in a region adjacent to the processing unit in at least two directions.

(11)

The stacked light-receiving sensor according to the (9), wherein the memory is disposed in a region sandwiching the processing unit from two directions.

(12)

The stacked light-receiving sensor according to the (9), wherein the processing unit is divided into and arranged in two regions in the second substrate, and the memory is disposed in a region sandwiched by the divided processing unit.

(13)

The stacked light-receiving sensor according to the (9), wherein the memory stores a computer program for the processing unit to perform the process.

(14)

The stacked light-receiving sensor according to any one of the (1) to (13), wherein the second substrate further includes a controller to control readout of the pixel signal from the pixel array, and the controller is disposed between the converter and the processing unit in the second substrate.

(15)

The stacked light-receiving sensor according to any one of the (1) to (14), wherein a size of a surface in the first substrate bonded to the second substrate is substantially equal to a size of a surface in the second substrate bonded to the first substrate.

(16)

The stacked light-receiving sensor according to any one of the (1) to (14), wherein a size of a surface in the first substrate bonded to the second substrate is smaller than a size of a surface in the second substrate bonded to the first substrate.

(17)

The stacked light-receiving sensor according to any one of the (1) to (16), wherein the first substrate and the second substrate are bonded together by one of chip-on-chip (CoC) technology, chip-on-wafer (CoW) technology, and wafer-on-wafer (WoW) technology.

(18)

The stacked light-receiving sensor according to any one of the (5) to (7), wherein the first substrate includes a pad proximate to at least one of sides different from the third side.

(19)

The stacked light-receiving sensor according to the (18), wherein the pad includes a first power supply pad receiving power supply voltage to be supplied to the converter and a second power supply pad receiving power supply voltage to be supplied to the processing unit, the first power supply pad is disposed at a position closer to the converter than the second power supply pad is, and the second power supply pad is disposed at a position closer to the processing unit than the first power supply pad is.

(20)

An Electronic Device Comprising:

a stacked light-receiving sensor including a first substrate and a second substrate bonded to the first substrate, the first substrate including a pixel array in which a plurality of unit pixels are arranged in a two-dimensional matrix, the second substrate including a converter configured to convert an analog pixel signal output from the pixel array to digital image data and a processing unit configured to perform a process based on a neural network calculation model for data based on the image data, at least a part of the converter being disposed on a first side in the second substrate, the processing unit being disposed on a second side opposite to the first side in the second substrate; and a processor configured to perform a predetermined process for image data output from the stacked light-receiving sensor.

(21)

A stacked light-receiving sensor comprising:

a first substrate; and a second substrate bonded to the first substrate, the first substrate including a pixel array in which a plurality of unit pixels are arranged in a two-dimensional matrix, the second substrate including
a converter configured to convert an analog pixel signal output from the pixel array to digital image data, and
a processing unit configured to perform a process based on a neural network calculation model for data based on the image data, wherein
the second substrate is bonded to the first substrate such that half or more of a region having the processing unit in the second substrate is not superimposed on a region having the pixel array in the first substrate, in a stacking direction of the first substrate and the second substrate.

REFERENCE SIGNS LIST 1 imaging device
10 image sensor
11 imager
12 controller
13 signal processor
14, 14A, 14B, 14C, 14D DSP (machine learning unit)
14a interconnect
15, 15A, 15B, 15C, 15D, 15E, 15F memory
16 selector
17, 17A ADC
17B DAC
20 application processor
30 cloud server
40 network
100, 200, 300 first substrate
101 pixel array
101a unit pixel
102 TSV array
103 pad array
104 optical system
120, 320 second substrate
L101 to L104 side
O100 center of first substrate
O101 center of pixel array

The invention claimed is:

1. A stacked light-receiving sensor comprising:
a first substrate; and
a second substrate bonded to the first substrate,
the first substrate including a pixel array in which a plurality of unit pixels are arranged in a two-dimensional matrix,
the second substrate including
a converter configured to convert an analog pixel signal output from the pixel array to digital image data and
a processor configured to perform a process based on a neural network calculation model for data based on the image data, wherein
at least a part of the converter is disposed on a first side in the second substrate, and
the processor is disposed on a second side opposite to the first side in the second substrate.

2. The stacked light-receiving sensor according to claim 1, wherein the neural network calculation model is designed based on a parameter generated by inputting, to a predetermined machine learning model, training data in which an input signal corresponding to output of the pixel array is associated with a label for the input signal.

3. The stacked light-receiving sensor according to claim 2, wherein the predetermined machine learning model is a multi-level neural network model.

4. The stacked light-receiving sensor according to claim 1, wherein the data based on the image data is the image data read out from the pixel array or image data with a data size reduced by decimating pixels of the image data.

5. The stacked light-receiving sensor according to claim 1, wherein the first substrate includes connection wiring on a third side corresponding to the first side of the second substrate in a state in which the first substrate and the second substrate are bonded together, the connection wiring electrically connecting the pixel array to the converter.

6. The stacked light-receiving sensor according to claim 5, wherein the connection wiring is a through silicon via (TSV) passing through the first substrate.

7. The stacked light-receiving sensor according to claim 5, wherein
the second substrate has connection wiring on the first side, the connection wiring being electrically connected to the converter, and
the connection wiring of the first substrate and the connection wiring of the second substrate are directly joined by metal joint.

8. The stacked light-receiving sensor according to claim 5, wherein the first substrate includes a pad proximate to at least one of sides different from the third side.

9. The stacked light-receiving sensor according to claim 8, wherein
the pad includes a first power supply pad receiving power supply voltage to be supplied to the converter and a second power supply pad receiving power supply voltage to be supplied to the processor,
the first power supply pad is disposed at a position closer to the converter than the second power supply pad is, and
the second power supply pad is disposed at a position closer to the processor than the first power supply pad is.

10. The stacked light-receiving sensor according to claim 1, wherein
the second substrate further includes a signal processor configured to perform signal processing for the image data, and
the signal processor is disposed between the converter and the processor in the second substrate.

11. The stacked light-receiving sensor according to claim 1, wherein
the second substrate further includes a memory to store data, and
the memory is disposed in a region adjacent to the processor in the second substrate.

12. The stacked light-receiving sensor according to claim 11, wherein the memory is disposed in a region adjacent to the processor in at least two directions.

13. The stacked light-receiving sensor according to claim 11, wherein the memory is disposed in a region sandwiching the processor from two directions.

14. The stacked light-receiving sensor according to claim 11, wherein
the processor is divided into and arranged in two regions in the second substrate, and
the memory is disposed in a region sandwiched by the divided processor.

15. The stacked light-receiving sensor according to claim 11, wherein the memory stores a computer program for the processor to perform the process.

16. The stacked light-receiving sensor according to claim 1, wherein
the second substrate further includes a controller to control readout of the pixel signal from the pixel array, and the controller is disposed between the converter and the processor in the second substrate.

17. The stacked light-receiving sensor according to claim 1, wherein a size of a surface in the first substrate bonded to the second substrate is equal to a size of a surface in the second substrate bonded to the first substrate.

18. The stacked light-receiving sensor according to claim 1, wherein a size of a surface in the first substrate bonded to the second substrate is smaller than a size of a surface in the second substrate bonded to the first substrate.

19. The stacked light-receiving sensor according to claim 1, wherein the first substrate and the second substrate are bonded together by one of chip-on-chip (CoC) technology, chip-on-wafer (CoW) technology, and wafer-on-wafer (WoW) technology.

20. An electronic device comprising:
a stacked light-receiving sensor including a first substrate and a second substrate bonded to the first substrate, the first substrate including a pixel array in which a plurality of unit pixels are arranged in a two-dimensional matrix, the second substrate including a converter configured to convert an analog pixel signal output from the pixel array to digital image data and a processor configured to perform a process based on a neural network calculation model for data based on the image data, at least a part of the converter being disposed on a first side in the second substrate, the processor being disposed on a second side opposite to the first side in the second substrate; and
a processor configured to perform a predetermined process for image data output from the stacked light-receiving sensor.

21. A stacked light-receiving sensor comprising:
a first substrate; and
a second substrate bonded to the first substrate,
the first substrate including a pixel array in which a plurality of unit pixels are arranged in a two-dimensional matrix,
the second substrate including
a converter configured to convert an analog pixel signal output from the pixel array to digital image data, and
a processor configured to perform a process based on a neural network calculation model for data based on the image data, wherein
the second substrate is bonded to the first substrate such that half or more of a region having the processor in the second substrate is not superimposed on a region having the pixel array in the first substrate, in a stacking direction of the first substrate and the second substrate.

* * * * *